(12) United States Patent
Nakamura et al.

(10) Patent No.: US 9,224,971 B2
(45) Date of Patent: Dec. 29, 2015

(54) ORGANIC ELECTROLUMINESCENCE DEVICE AND DISPLAY UNIT

(75) Inventors: Akifumi Nakamura, Kanagawa (JP); Yasuharu Ujiie, Kanagawa (JP); Yasunori Kijima, Tokyo (JP)

(73) Assignee: JOLED INC., Tokyo (JP)

( * ) Notice: Subject to any disclaimer, the term of this patent is extended or adjusted under 35 U.S.C. 154(b) by 486 days.

(21) Appl. No.: 12/949,989

(22) Filed: Nov. 19, 2010

(65) Prior Publication Data

US 2011/0127505 A1 Jun. 2, 2011

(30) Foreign Application Priority Data

Dec. 2, 2009 (JP) .................................. 2009-274877

(51) Int. Cl.
*H01L 51/50* (2006.01)
*H01L 51/00* (2006.01)

(52) U.S. Cl.
CPC ........... *H01L 51/5088* (2013.01); *H01L 51/006* (2013.01); *H01L 51/0052* (2013.01); *H01L 51/0059* (2013.01); *H01L 51/0072* (2013.01)

(58) Field of Classification Search
USPC ...................... 562/30, 45, 56, 74, 89; 257/40, 257/E51.032, E51.05, E51.026; 428/690, 428/917; 313/504, 505, 506
See application file for complete search history.

(56) References Cited

U.S. PATENT DOCUMENTS

| | | | |
|---|---|---|---|
| 2002/0096995 A1* | 7/2002 | Mishima et al. | 313/506 |
| 2006/0049747 A1* | 3/2006 | Matsuda et al. | 313/504 |
| 2008/0029742 A1* | 2/2008 | Yoshimoto et al. | 252/500 |

FOREIGN PATENT DOCUMENTS

| | | |
|---|---|---|
| JP | 2002-151272 | 5/2002 |
| JP | 2003-234193 | 8/2003 |
| JP | 2006-079836 | 3/2006 |

* cited by examiner

*Primary Examiner* — Gregory Clark
(74) *Attorney, Agent, or Firm* — Dentons US LLP

(57) ABSTRACT

An organic electroluminescence device having high light emitting efficiency and improved reliability is provided. The organic electroluminescence device includes: an anode containing at least aluminum (Al); a cathode; and an organic layer between the anode and the cathode, the organic layer including a light emitting layer. The organic layer has a hole injection layer composed of a sulfonic acid derivative between the anode and the light emitting layer.

12 Claims, 4 Drawing Sheets

ORGANIC ELECTROLUMINESCENCE DEVICE AND DISPLAY UNIT

BACKGROUND OF THE INVENTION

1. Field of the Invention

The present invention relates to an organic electroluminescence device used in a color display and the like, and a display unit using the organic electroluminescence device.

2. Description of the Related Art

In recent years, so-called organic electronics has been receiving attention. Organic electronics is technology related to organic electroluminescence (organic EL), organic solar cells, organic transistors, organic memories, and the like in which organic materials formed into thin films are used in displays, batteries, transistors, recording devices, and the like.

Among organic electronics, organic EL is receiving attention as a next-generation display technology. Specifically, in 1987, Dr. Tang and others of Eastman Kodak Company presented an organic electroluminescence device capable of low-voltage drive and high-intensity light emission. The organic electroluminescence device includes an organic layer between an anode and a cathode. The organic layer has a lamination structure including a hole transport layer, a light emitting layer, an electron transport layer, and the like.

Since then, research and development of organic electroluminescence devices has been thriving. However, light emitting life of the organic electroluminescence device is short for use in displays necessitating a long life, and sufficient life characteristics are not able to be obtained. Therefore, to improve life characteristics, organic materials (organic EL materials) used in the organic layer, particularly a hole transport material used in the hole transport layer, are being studied. Specifically, a technology that uses a carbazole derivative as the hole transport material has been proposed.

As a result of such research on organic EL materials, life characteristics sufficient for use as displays for mobile phones and MP3 players and displays, such as a viewfinder of a camcorder, are able to be ensured. As a result, commercialization as displays for use in on-vehicle audio equipment and mobile devices is advancing. However, display life for use as television displays, such as cathode ray tube (CRT) and liquid crystal displays, has not been reached. Therefore, organic electroluminescence devices with further improved life characteristics for use in household display units replacing CRT, plasma displays, and liquid crystal displays are being developed.

A top emission type organic electroluminescence device is known as an organic electroluminescence device used in the foregoing display unit. Specifically, as illustrated in FIG. 4, for example, a top emission type organic electroluminescence device 101 has a structure in which a light-reflective anode 103, an organic layer 104, and a light-transmissive cathode 105 are sequentially layered on a drive substrate 102. The drive substrate 102 has a drive circuit, such as a thin film transistor (TFT). The organic layer 104 includes a hole transport layer 104A, a light emitting layer 104B, and an electron transport layer 104C in sequence from the anode 103 side. Therefore, emitted light is able to be extracted from the other side (cathode 105 side) of the drive substrate 102, thereby being advantageous for improving an aperture ratio of a light emitting section. Improvement of the aperture ratio enables sufficient light emission intensity to be obtained even in the case where current density applied to the organic layer 104 is reduced, thus leading to improvement in life characteristics.

The anode in such top emission type organic electroluminescence device is composed of a high-reflectance material to efficiently extract emitted light from the cathode side. An example of the material is aluminum. However, aluminum has a relatively small work function. Therefore, sufficient injection of holes into the organic layer is difficult and favorable light emitting efficiency is difficult to obtain. Thus, in compensation, use of an aluminum alloy is proposed (see, for example, Japanese Unexamined Patent Application Publication No. 2003-234193) in which the aluminum alloy contains from 20% to 30%, both inclusive, metal having a high work function, such as copper, palladium, gold, or nickel, as an accessory component metal.

As the materials composing the anode, use of aluminum as a main component and neodymium or the like that is less expensive than palladium and the like and has a relatively smaller work function than that of aluminum as the accessory component metal is also proposed (see, for example, Japanese Unexamined Patent Application Publication No. 2006-079836). In this case, an azatriphenylene or triphenylene derivative is used as the material composing the hole injection layer provided on the anode. However, since materials having hole injection characteristics have strong crystalline, a microcrystalline thin film is easily formed. As a result, peeling and infiltration of moisture occur. A dark spot tends to grow if the organic electroluminescence device is driven for a long period, causing disadvantages in reliability.

Each layer forming the organic layer is ordinarily formed by a vapor phase deposition method, such as vacuum evaporation method. In this case, for example, if foreign matter is present on the anode, the organic layer is formed over the foreign matter. Therefore, an area that is not covered (uncovered section) is formed on the anode. When the cathode is provided on the organic layer in a state in which the uncovered section is formed, the anode and the cathode short-circuit in the uncovered section. Light is not emitted in a pixel where the short circuit occurs, thereby further reducing reliability.

Therefore, to solve the foregoing disadvantages, formation of a mixed layer as a hole injection layer by a coating method is proposed in which, in the mixed layer, an aniline derivative is doped with an electron acceptor substance (see, for example, Japanese Unexamined Patent Application Publication No. 2002-151272).

SUMMARY OF THE INVENTION

However, the technology described in Japanese Unexamined Patent Application Publication No. 2002-151272 is disadvantageous in that, depending on coating conditions, firing conditions after coating, and the like, the electron acceptor substance that significantly affects hole injection characteristics of hole injection from the anode aggregates and becomes unevenly distributed within the film. As a result, light emitting efficiency may decrease. Since a composition of two or more types of materials is used in the hole injection layer, maintaining a homogenous composition becomes difficult. Therefore, an organic electroluminescence device having higher light emitting efficiency and higher reliability is desired.

In view of the foregoing, in the invention, it is desirable to provide an organic electroluminescence device having high light emitting efficiency and improved reliability, and a display unit.

According to an embodiment of the invention, there is provided an organic electroluminescence device including an anode containing at least aluminum (Al), a cathode, and an organic layer between the anode and the cathode, the organic layer including a light emitting layer. The organic layer has a hole injection layer composed of a sulfonic acid derivative between the anode and the light emitting layer. According to an embodiment of the invention, there is provided a display unit including the foregoing organic electroluminescence device.

Here, the sulfonic acid derivative is a compound having one or two or more sulfonic acids within its structure. However, the hole injection layer composed of a sulfonic acid derivative is not excluded from containing material other than the sulfonic acid derivative therein. For example, the hole injection layer may contain a solvent used for composition of the sulfonic acid derivative and impurities included in the solvent, and impurities, water, and the like that become mixed when the hole injection layer or other organic layer is formed.

In the organic electroluminescence device and the display unit of the embodiment of the invention, the hole injection layer composed of a sulfonic acid derivative is provided between the anode and the light emitting layer. Therefore, favorable hole injection characteristics for hole injection from the anode containing at least aluminum to the light emitting layer are able to be obtained. As a result, when an electric field is applied to the organic layer, the light emitting layer efficiently emits light in response to the applied current. Further, compared to when the hole injection layer contains another compound in addition to a sulfonic acid derivative or when the hole injection layer is composed of a compound other than a sulfonic acid derivative, a highly homogenous hole injection layer is able to be obtained without being affected by the environment during manufacturing. Therefore, favorable hole injection characteristics are able to be maintained for a long period.

According to the organic electroluminescence device and the display unit of the embodiment of the invention, the hole injection layer composed of a sulfonic acid derivative is provided between the anode containing at least aluminum and the light emitting layer. Therefore, favorable hole injection characteristics of hole injection to the light emitting layer are able to be obtained. As a result, high light emitting efficiency is able to be obtained. Further, since a highly homogenous hole injection layer is able to be obtained, light emission intensity is able to be maintained even if the organic electroluminescence device is driven for a long period, and reliability, such as life characteristics and the like, is able to be improved.

Other and further objects, features and advantages of the invention will appear more fully from the following description.

DETAILED DESCRIPTION OF THE PREFERRED EMBODIMENTS

An embodiment of the invention will be hereinafter described in detail with reference to the drawings. The description will be given in the following order:

1. Organic electroluminescence device (example of a top emission type)
2. Display unit (usage example of the organic electroluminescence device)
3. Modified example 1. Organic Electroluminescence Device (Example of a Top Emission Type)

Figure 1:
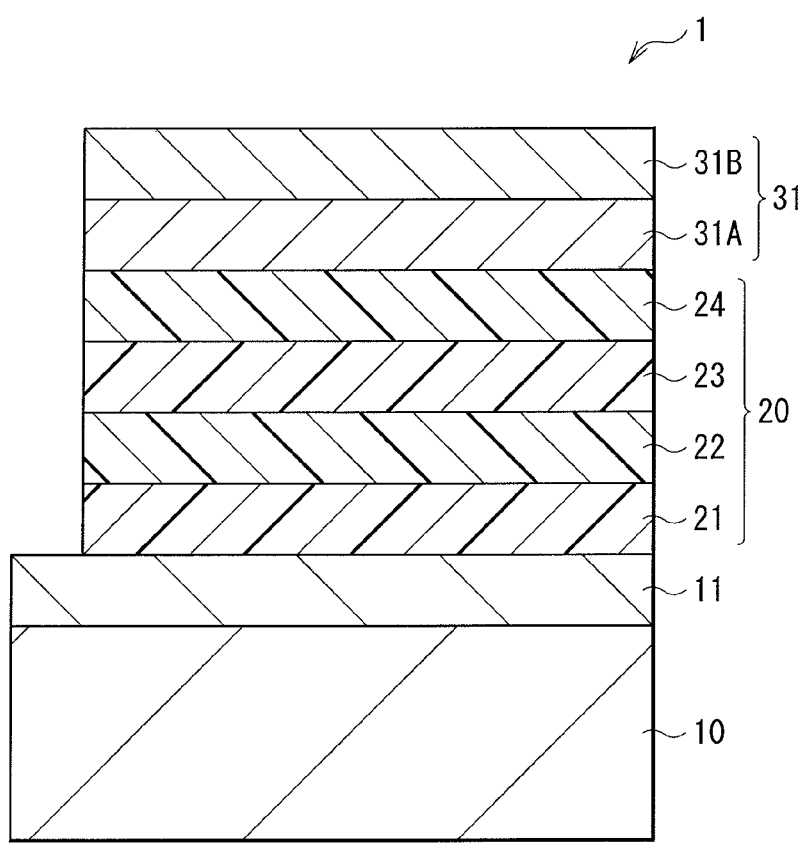
FIG. 1 is a schematic diagram illustrating a cross-sectional structure of an organic electroluminescence device according to an embodiment of the invention.

FIG. 1 illustrates a cross-sectional structure of an organic electroluminescence device 1 according to an embodiment of the invention. The organic electroluminescence device 1 (organic EL device) is used, for example, in a display unit, such as a color display. The organic electroluminescence device 1 includes an anode 11, an organic layer 20, and a cathode 31 in sequence on a substrate 10. The organic layer 20 has a structure in which a hole injection layer 21, a hole transport layer 22, a light emitting layer 23, and an electron transport layer 24 are layered in sequence from the anode 11 side. Here, a top emission type organic electroluminescence device in which light emitted from the light emitting layer 23 (referred to, hereinafter, as emitted light) is extracted from the cathode 31 side will be described.

The substrate 10 is composed to include, for example, a transparent substrate such as glass, a silicon substrate, a film-like flexible substrate, and the like. If a drive system of a display unit using a plurality of organic electroluminescence devices 1 is an active matrix drive system, the substrate 10 may be provided with a drive circuit, such as a TFT, for each pixel. In the substrate 10 in this case, the anode 11 is provided for each pixel in a matrix form. As a result, each pixel is independently driven in the display unit using the active matrix drive system.

The anode 11 is one of the electrodes that apply an electric field to the light emitting layer 23 and is formed to be capable of reflecting visible light. The anode 11 is preferably formed to be capable of reflecting substantially all wavelength components of visible light to improve light emitting efficiency. The anode 11 is composed to contain at least aluminum. Aluminum has high reflectance and is relatively inexpensive. Therefore, light emitting efficiency is improved and manufacturing cost is reduced as a result of the anode 11 containing aluminum. As a material composing the anode 11, for example, an alloy that contains aluminum as a main component and an element having a relatively smaller work function than that of aluminum as an accessory component (referred to, hereinafter, as an aluminum alloy) is preferable, since stability of the anode 11 is able to be improved and sufficient hole injection characteristics are able to be obtained. As the accessory component in the aluminum alloy, a lanthanoid series element is particularly preferable. Although the work function of lanthanoid series elements is not high, sufficient hole injection characteristics are able to be obtained and stability is further improved as a result of the anode 11 being composed of an aluminum alloy containing a lanthanoid series element. Other than a lanthanoid series element, the aluminum alloy may contain silicon, copper, and the like as the accessory component. The content of the accessory component element within the aluminum alloy is preferably 10 wt % or less. As a result, favorable reflectance is obtained and conductivity is increased in the anode 11. Adhesion between the anode 11 and the substrate 10 is also improved. Further, in manufacturing the organic electroluminescence device 1, the reflectance of the aluminum alloy is favorably and stably maintained, and high processing accuracy and chemical stability are obtained.

In the case where the anode 11 uses the foregoing aluminum alloy as a component material, for example, the anode 11 may be formed by a plurality of layers. Specifically, the anode 11 may have a two-layer structure in which a layer containing the aluminum alloy is a first layer, and a second layer having excellent light transmittance is provided on the organic layer 20 side. Examples of a material composing the second layer having excellent light transmittance include an oxide of the foregoing aluminum alloy, an oxide of tungsten, an oxide of molybdenum, an oxide of zirconium, an oxide of chrome, an oxide of tantalum, an oxide of vanadium, an oxide of tin, an oxide of zinc, an oxide of indium and tin (ITO), and an oxide of indium and zinc (IZO). In particular, if the first layer of the aluminum alloy is not maintained in an ultra-high vacuum after the first layer containing the aluminum alloy is formed, the surface is oxidized to naturally form the oxide of the aluminum alloy. Therefore, an oxide of the aluminum alloy is preferable since a film formation process, such as vacuum evaporation and sputtering, is not necessary. Further, with the layer containing the aluminum alloy as the first layer, a second layer having conductivity may be formed between the first layer and the substrate 10 to improve adhesion between the anode 11 and the substrate 10. An example of a material composing the second layer having conductivity includes a transparent conductive material, such as ITO and IZO. The anode 11 may have a combination of both forgoing two-layer structures. In other words, the anode 11 may have a three-layer structure including the layer having conductivity for improving adhesion with the substrate 10, the layer containing the aluminum alloy provided on the layer having conductivity, and the layer having excellent light transmittance provided on the layer containing the aluminum alloy.

The main component of the anode 11 is not limited to aluminum and may be, for example, nickel, silver, gold, platinum, palladium, selenium, rhodium, ruthenium, iridium, rhenium, tungsten, molybdenum, chrome, tantalum, or niobium, an alloy containing one type or two or more types of the foregoing elements, or an oxide thereof. The main component of the anode 11 may also be tin oxide, ITO, zinc oxide, titanium oxide, and the like. The foregoing components may be used singly, or a plurality of types may be used in combination.

The hole injection layer 21 included in the organic layer 20 is intended to efficiently inject holes formed in the anode 11 into the hole transport layer 22. The hole injection layer 21 is composed of one type or two or more types of sulfonic acid derivatives. A sulfonic acid derivative has electron acceptance characteristics. Therefore, the holes from the anode 11 are able to be more efficiently injected into the hole transport layer 22 as a result of the hole injection layer 21 accepting electrons from the hole transport layer 22 side and transporting the electrons to the anode 11. In other words, hole injection characteristics of hole injection from the anode 11 to the light emitting layer 23 are improved by the sulfonic acid derivative acting as an electron acceptor substance. Therefore, drive voltage is able to be reduced, a high light emitting efficiency is able to be obtained, and life characteristics are able to be improved. Further, homogeneity of the hole injection layer 21 is improved without being affected by the environment during manufacturing as a result of the hole injection layer 21 being composed only of the sulfonic acid derivative. Therefore, formation of dark spots and growth of dark spots caused by driving over a long period are suppressed. Moreover, reliability is improved since adhesion with the anode 11 is high. The hole injection layer 21 may contain impurities and water in addition to the sulfonic acid derivative, as long as the foregoing characteristics (effects) are not affected. The content of impurities and the like within the hole injection layer 21 is, for example, about 2 wt %.

The sulfonic acid derivative may be arbitrarily selected, as long as the sulfonic acid derivative is a compound containing one or two or more sulfonic acid groups. For example, a compound expressed by Formula 1 is given, since excellent hole injection characteristics are able to be obtained. One type of the compound indicated in Formula 1 may be used singly, or a plurality of types may be mixed and used. The compound may also be used in combination with other sulfonic acid derivative.

Formula 1

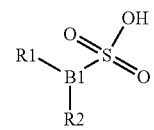

(1)

In the formula, B1 represents a trivalent group containing a benzene ring, a naphthalene ring, an anthracene ring, a phenanthrene ring, or a heterocycle. R1 and R2 represent a carboxyl group or a hydroxyl group.

The compound indicated in Formula 1 is a sulfonic acid compound containing a hydroxyl group or a carboxyl group. If B1 described in Formula 1 contains the benzene ring or the like as described above, a substituent may be further introduced into the benzene ring or the like. Examples of the substituent introduced into the benzene ring or the like include a halogen atom, a hydrocarbon group, and a sulfonic acid group. The sulfonic acid group bound to B1 may bind to the carbon atom composing the benzene ring or the like contained in B1, or may bind to the substituent introduced into the benzene ring or the like. The sulfonic acid group preferably binds with the carbon atom composing the benzene ring or the like, since high hole injection characteristics are able to be obtained. The same applies to R1 and R2 that bind to B1. R1 and R2 may be the same type of group or different types of groups.

Specific examples of the compound indicated in Formula 1 include a compound (5-sulfosalicylic acid) expressed in Formula (1-1) and a compound (4-sulfophthalic acid) expressed in Formula (1-2), since sufficient hole injection characteristics are able to be obtained. However, the compound indicated in Formula 1 is not limited to the following compounds.

Formula (1-1) and (1-2)

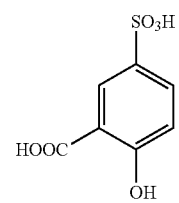

(1-1)

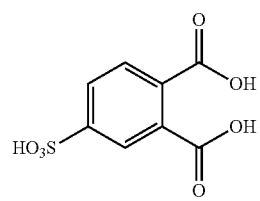

(1-2)

Examples of the sulfonic acid derivative include a compound expressed in Formula 2, a compound having a structure expressed in Formula 3, and a polymer compound having a structure expressed in Formula 4, since excellent hole injection characteristics are able to be obtained. The compounds may be used singly, or a plurality of types may be mixed and used. The compounds may also be used in combination with other sulfonic acid derivative.

Formula 2

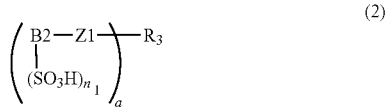
(2)

In the formula, Z1 represents an oxygen atom, a sulfur atom, or —NH—. B2 represents an ($n_1$+1) valent group containing a naphthalene ring or an anthracene ring. R3 represents a hydrocarbon group, a group containing a 1,3,5-triazine ring, a group having a structure expressed in Formula 5, a group having a structure indicated in Formula 6, or a derivative of the foregoing groups. The valance is a, a being an integer that is 1 or greater. $n_1$ is an integer that is from 1 to 4, both inclusive.

Formula 3

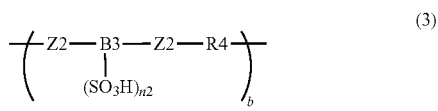
(3)

In the formula, Z2 respectively and independently represents an oxygen atom, a sulfur atom, or —NH—. B3 represents an ($n_2$+2) valent group containing a naphthalene ring or an anthracene ring. R4 represents a hydrocarbon group, a group containing a 1,3,5-triazine ring, a group having the structure indicated in Formula 5, a group having the structure indicated in Formula 6, or a derivative of the foregoing groups. b is an integer that is 1 or greater. $n_2$ is an integer that is from 1 to 4, both inclusive.

Formula 4

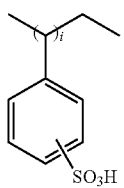
(4)

In the formula, i is an integer that is 1 or greater.

Formula 5 and 6

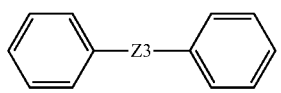
(5)

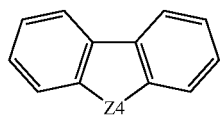
(6)

In the formulas, Z3 and Z4 represent an oxygen atom, a sulfur atom, a sulfinyl group (—S(=O)—), a sulfonyl group (—S(=O)$_2$—), or a group containing any of a nitrogen atom, a silicon atom, a phosphorus atom, or a P(=O) group.

The compound indicated in Formula 2 contains a naphthalene ring or an anthracene ring, and one or two or more of a sulfonic acid group. Regarding Z1 described in Formula 2, the oxygen atom represents —O— (oxo group or ether bond) and the sulfur atom represents —S— (thio group or thioether bond). The same applies hereafter. If B2 described in Formula 2 contains the naphthalene ring or the like, a substituent may be further introduced into the naphthalene ring or the like. Examples of the substituent introduced into the naphthalene ring or the like include a halogen atom and a hydrocarbon group. Therefore, Z1 and the sulfonic acid group that bind to B2 may bind to the carbon atom composing the naphthalene ring or the like contained in B2, or may bind to the substituent introduced into the naphthalene ring or the like. Z1 and the sulfonic acid group preferably bind to the carbon atom composing the naphthalene ring or the like, since high hole injection characteristics are able to be obtained. Details of R3 described in Formula 2 are as follows. The hydrocarbon group may be a linear chain or may be branched. The hydrocarbon group may include an alicyclic structure or an annular structure, such as an aromatic ring. In particular, the hydrocarbon group preferably contains an aromatic ring, since high hole injection characteristics are able to be obtained. A derivative of the hydrocarbon group or the like (hydrocarbon group, group containing a 1,3,5-triazine ring, group having the structure indicated in Formula 5, or group having the structure indicated in Formula 6) is a group in which one or two or more of the hydrogen atoms contained in the hydrocarbon group or the like are substituted with other atoms or atom groups. In other words, the derivative is a group in which a substituent is introduced to the hydrocarbon group or the like. The substituent may be a hydrocarbon group, a halogen atom, a sulfonic acid group, or other groups. The definition of the derivative also applies hereafter.

Regarding Z3 described in Formula 5 and Z4 described in Formula 6, the group containing any of a nitrogen atom, a silicon atom, a phosphorus atom, or a P(=O) group may additionally contain a hydrogen atom, a halogen atom, or a substituent, as long as the group contains the foregoing atoms or the P(=O) group.

The compound having the structure indicated in Formula 3 contains a naphthalene ring or an anthracene ring and one or two or more sulfonic acid groups within a repeat unit thereof. Z2 described in Formula 3 may be the same type of group or different types of groups. Further details of Z2 are similar to those of Z1 described in Formula 2. Details related to B3 described in Formula 3 are similar to those of B2 described in Formula 2. Details related to R4 described in Formula 3 are similar to those of R3 described in Formula 2.

The polymer compound having the structure indicated in Formula 4 is a styrenesulfonic acid derivative. i described in Formula 4 represents, for example, a polymerization degree of the styrenesulfonic acid derivative. i is arbitrary as long as it is 1 or greater, but is preferably about 1000 since high hole injection characteristics are able to be obtained and the hole injection layer 21 is more easily formed by a coating method. i equaling about 1000 indicates a state in which a styrenesulfonic acid derivative having i that is 1000 or greater and a styrenesulfonic acid derivative having i that is less than 1000 are mixed. The average of i is about 1000.

Specific examples of the compound indicated in Formula 2 include compounds expressed in Formula (2-1) and Formula (2-2), since sufficient hole injection characteristics are able to be obtained. A specific example of the compound having the structure indicated in Formula 3 includes a compound having a structure expressed in Formula (3-1), since sufficient hole injection characteristics are able to be obtained. However, the compound indicated in Formula 2 and the compound having the structure indicated in Formula 3 are not limited to the compounds below. A specific example of the polymer compound having the structure indicated in Formula 4 includes a polymer compound of which i in Formula 4 is about 1000, since sufficient hole injection characteristics are able to be obtained.

Formulas (2-1), (2-2) and (3-1)

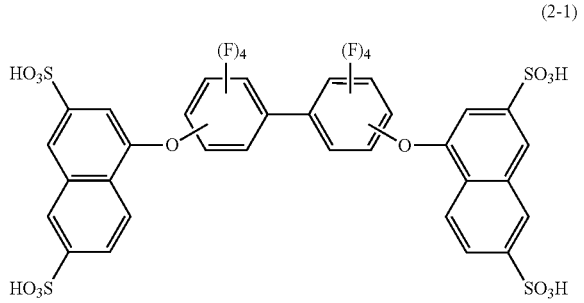

(2-1)

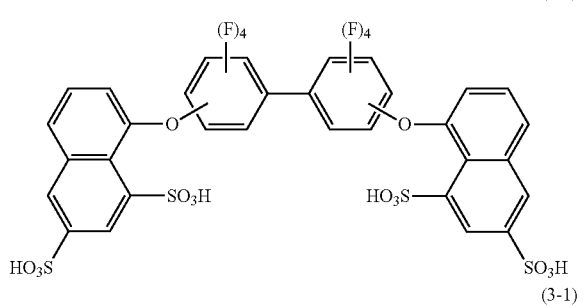

(2-2)

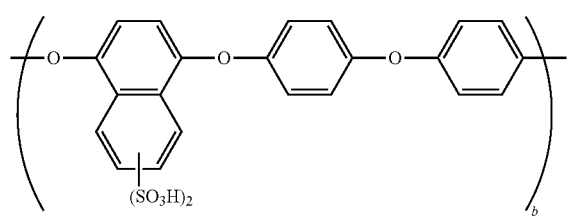

(3-1)

In Formula (3-1), b is 5.

Examples of the sulfonic acid derivative include a compound expressed by Formula 7, a compound expressed by Formula 8, a compound having a structure expressed by at least Formula 9 of Formula 9 and Formula 10, and a compound having a structure expressed by at least Formula 11 of Formula 11 and Formula 12, since excellent hole injection characteristics are able to be obtained. The compounds may be used singly, or a plurality of types may be mixed and used. The compounds may also be used in combination with other sulfonic acid derivative.

Formula 7

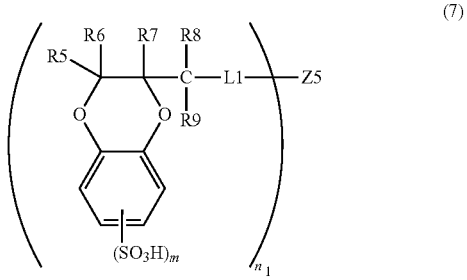

(7)

In the formula, R5 to R9 represent a hydrogen atom or a halogen atom; or a hydrocarbon group or a derivative thereof. L1 represents a single bond; or an oxygen atom, a sulfur atom, or —NH—. Z5 represents a hydrogen atom, a sulfinyl group, or a sulfonyl group; a hydrocarbon group, a group containing a 1,3,5-triazine ring, a group having the structure indicated in Formula 5, a group having the structure indicated in Formula 6, or a derivative of the foregoing groups; a group containing any of a nitrogen atom, a silicon atom, a phosphorus atom, and P(=O) group; or, if L1 represents a single bond, a halogen atom or a sulfur atom. $n_1$ is an integer that is 1 or greater. m is an integer that is from 1 to 4, both inclusive.

Formula 8

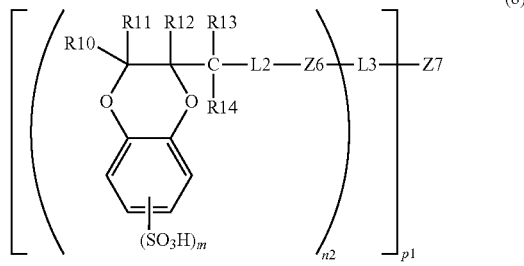

(8)

In the formula, R10 to R14 represent a hydrogen atom or a halogen atom; or a hydrocarbon group or a derivative thereof. L2 and L3 represent a single bond; or an oxygen atom, a sulfur atom, or —NH—. Z6 represents a hydrocarbon group, a group containing a 1,3,5-triazine ring, a group having the structure indicated in Formula 5, a group having the structure indicated in Formula 6, or a derivative of the foregoing groups. The valence thereof is ($n_2$+1). Z7 represents a hydrogen atom, a sulfinyl group, or a sulfonyl group; a hydrocarbon group, a group containing a 1,3,5-triazine ring, a group having the structure indicated in Formula 5, a group having the structure indicated in Formula 6, or a derivative of the foregoing groups; a group containing any of a nitrogen atom, a silicon atom, a phosphorus atom, and P(=O) group; or, if L2 and L3 represent a single bond, a halogen atom or a sulfur atom. The valence thereof is $p_1$. m is an integer that is from 1 to 4, both inclusive. $n_2$ and $p_1$ are integers that are 1 or greater.

Formula 9 and 10

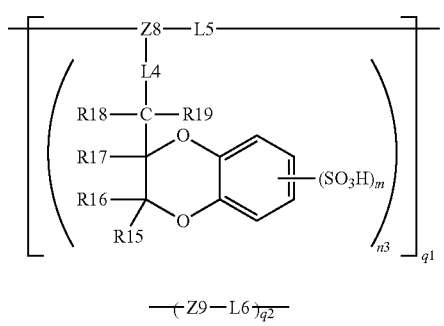

In the formulas, R15 to R19 represent a hydrogen atom or a halogen atom; or a hydrocarbon group or a derivative thereof. L4 to L6 represent a single bond; or an oxygen atom, a sulfur atom, or —NH—. Z8 represents a hydrocarbon group, a group containing a 1,3,5-triazine ring, a group having the structure indicated in Formula 5, a group having the structure indicated in Formula 6, or a derivative of the foregoing groups. The valence thereof is $(n_3+2)$. Z9 represents a hydrocarbon group, a group containing a 1,3,5-triazine ring, a group having the structure indicated in Formula 5, a group having the structure indicated in Formula 6, or a derivative of the foregoing groups. m is an integer that is from 1 to 4, both inclusive. $n_3$ and $q_1$ are integers that are 1 or greater. $q_2$ is an integer that is 0 or greater. However, $q_1$ and $q_2$ satisfy $1 \leq q_1 + q_2 \leq 10000$.

Formulas 11 and 12

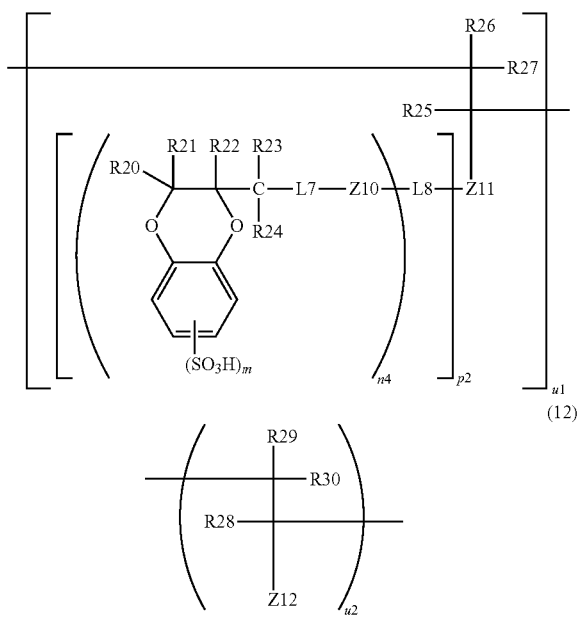

In the formulas, R20 to R30 represent a hydrogen atom or a halogen atom; or a hydrocarbon group or a derivative thereof. L7 and L8 represent a single bond; or an oxygen atom, a sulfur atom, or —NH—. Z10 to Z12 represent a hydrocarbon group, a group containing a 1,3,5-triazine ring, a group having the structure indicated in Formula 5, a group having the structure indicated in Formula 6, or a derivative of the foregoing groups. The valence of Z10 is $(n_4+1)$. The valence of Z11 is $(p_2+1)$. m is an integer that is from 1 to 4, both inclusive. $n_4$, $p_2$ and $u_1$ are integers that are 1 or greater. $u_2$ is an integer that is 0 or greater. However, $u_1$ and $u_2$ satisfy $1 \leq u_1 + u_2 \leq 10000$.

All compounds and the like indicated in Formula 7 are 1,4-benzodioxane sulfonic acid compounds in which one or two or more sulfonic acid groups are introduced into a benzene ring of a 1,4-benzodioxane skeleton.

Regarding the compound indicated in Formula 7, R5 to R9 may be the same type of group or different types of groups. Details of R5 to R9 are as follows. The type of halogen atom is arbitrary, such as fluorine, chlorine, and iodine. In particular, fluorine is preferable since higher hole injection characteristics are able to be obtained. The carbon number, structure, and the like of the hydrocarbon group are arbitrary. The hydrocarbon group may be, for example, an alkyl group, an alkenyl group, an alkynyl group, a cycloalkyl group, or a phenyl group. A derivative of the hydrocarbon group is, for example, a halogenated alkyl group. Regarding L1 described in Formula 7, the single bond indicates that the carbon atom to which R8 and R9 are introduced is directly bonded to Z5. Details of Z5 described in Formula 7 are as follows. Regarding the hydrocarbon group or the like and the derivative thereof, the same as the foregoing regarding the hydrocarbon group or the like of R3 in Formula 2 applies. Regarding the group containing any of a nitrogen atom, a silicon atom, a phosphorus atom, or a P(=O) group, the same as that regarding the group containing a nitrogen atom and the like of Z4 described in Formula 4 applies. However, if L1 is a single bond, Z5 is a halogen atom or a sulfur atom.

Regarding the compound indicated in Formula 8, R10 to R14 may be the same type of group or different types of groups. The same applies to L2, L3, Z6, and Z7. Details related to R10 to R14 are similar to the details related to R5 to R9 in Formula 7. Details related to L2 and L3 are similar to the details related to L1 in Formula 7. Details related to Z6 and Z7 are similar to the details related to Z5 in Formula 7, excluding the valence of the groups. If both L2 and L3 are single bonds, Z6 and Z7 are a halogen atom or a sulfur atom.

Regarding the compound having the structure indicated in at least Formula 9 of Formula 9 and Formula 10 (referred to, hereinafter, as a compound having a structure indicated in Formula 9), R15 to R19 may be the same type of group or different types of groups. The same applies to L4 to L6, Z8, and Z9. Details related to R15 to R19 are similar to the details related to R5 to R9 in Formula 7. Details related to L4 to L6 are similar to the details related to L1 in Formula 7. Details related to Z8 and Z9 are similar to the details related to Z5 in Formula 7, excluding the valence of the groups. Z9 may be a group having a valence of 2 or greater.

Regarding the compound having the structure indicated in at least Formula 11 of Formula 11 and Formula 12 (referred to, hereinafter, as a compound having a structure indicated in Formula 11), R20 to R30 may be the same type of group or different types of groups. The same applies to L7 and L8, and Z10 to Z12. Details related to R20 to R30 are similar to the details related to R5 to R9 in Formula 7. Details related to L7 and L8 are similar to the details related to L1 in Formula 7. Details related to Z10 to Z12 are similar to the details related to Z5 in Formula 7, excluding the valence of the groups.

Specific examples of the compound indicated in Formula 7 include compounds expressed in Formula (7-1) and Formula (7-2), since sufficient hole injection characteristics are able to be obtained. Specific examples of the compound indicated in Formula 8 include compounds expressed in Formula (8-1) to Formula (8-4), since sufficient hole injection characteristics are able to be obtained. A specific example of the compound having the structure indicated in Formula 9 includes a compound having a structure expressed in Formula (9-1), since sufficient hole injection characteristics are able to be obtained. A specific example of the compound having the structure indicated in Formula 11 includes a compound having a structure expressed in Formula (11-1), since sufficient hole injection characteristics are able to be obtained. However, the compound indicated in Formula 7, the compound indicated in Formula 8, the compound having the structure indicated in Formula 9, and the compound having the structure indicated in Formula 11 are not limited to the compounds below.

Formulas (7-1) and (7-2)

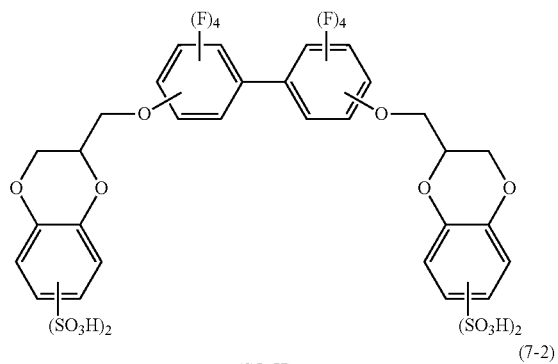

(7-1)

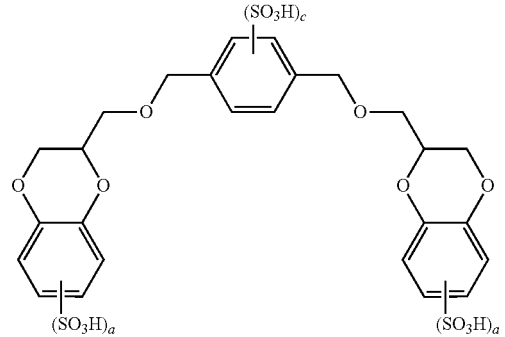

(7-2)

In Formula (7-2), a, b, and c are integers satisfying $2 \leq a+b+c \leq 4$.

Formulas (8-1) and 8(2)

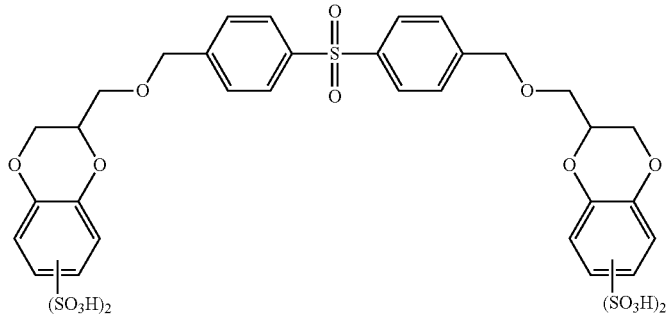

(8-1)

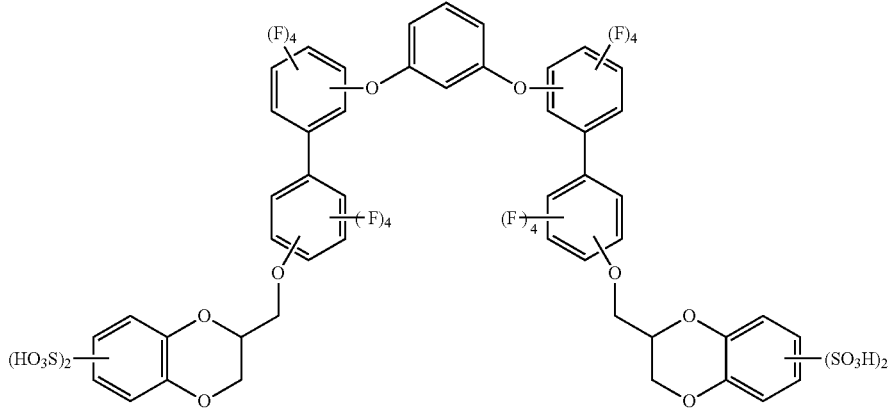

(8-2)

Formulas (8-3) and (8-4)
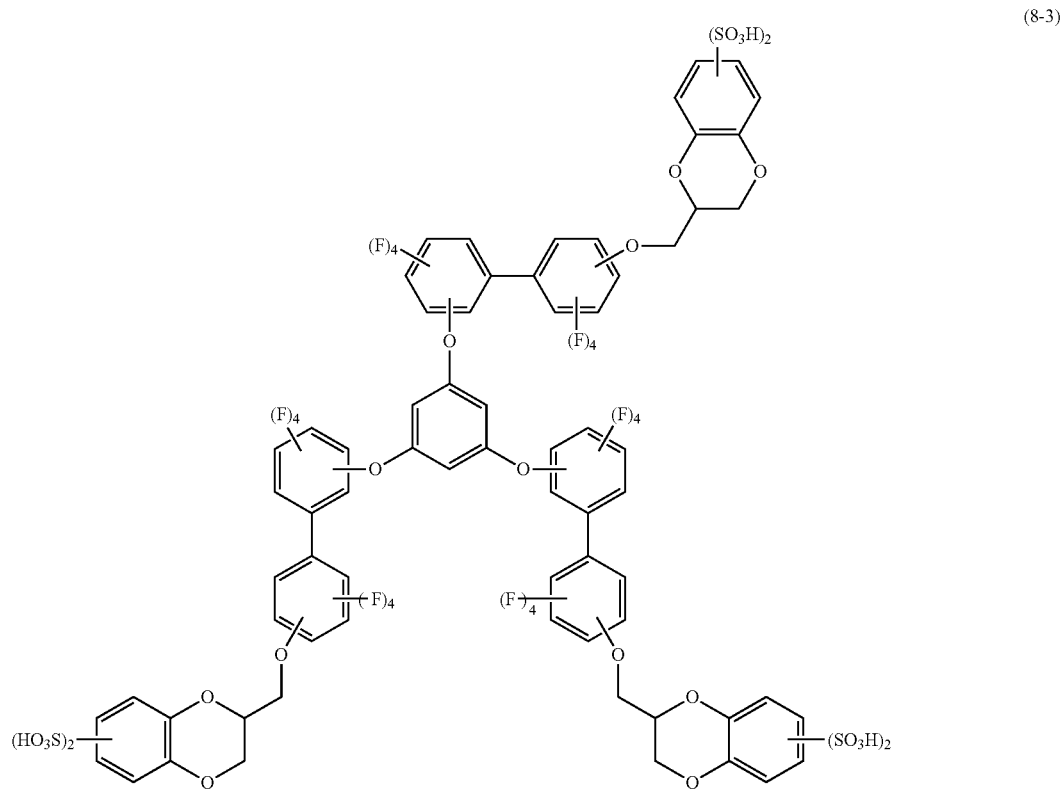
(8-3)
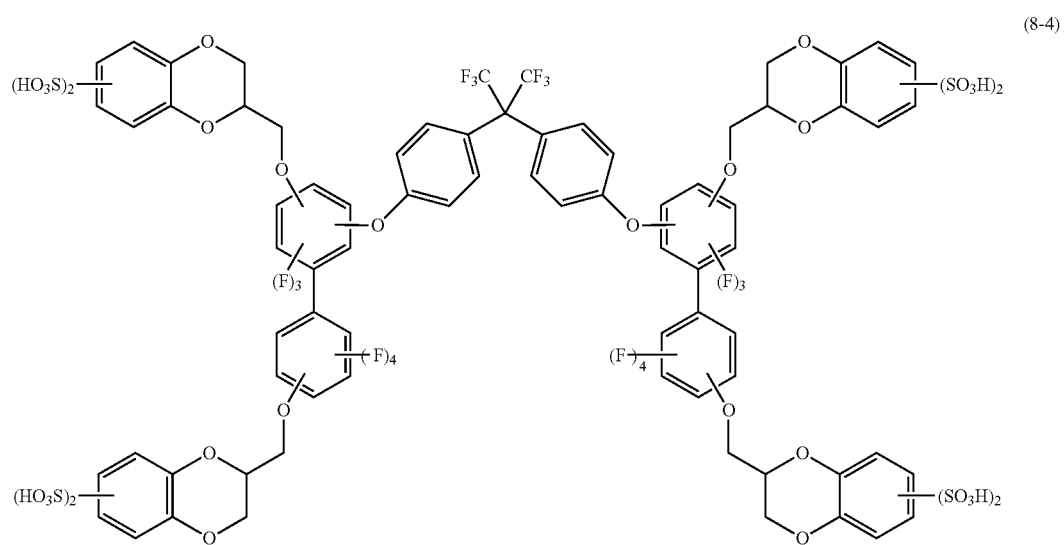
(8-4)

Formulas (9-1) and (11-1)

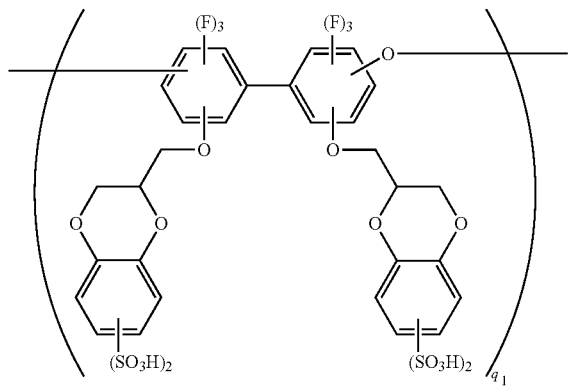

(9-1)

(11-1)

In Formula (9-1), $q_1$ equals 5. In Formula (11-1), $u_1$ is 5. Three oxygen atoms that bind to a biphenyl skeleton bind to any of the carbon atoms composing the biphenyl skeleton. Seven fluorine atoms that bind to the biphenyl skeleton bind to carbon atoms not bound to the oxygen atoms among the carbon atoms composing the biphenyl skeleton.

An example of the sulfonic acid derivative is a compound having a structure expressed in Formula 13, since excellent hole injection characteristics are able to be obtained. The compound may be used singly, or a plurality of types may be mixed and used. The compound may also be used in combination with other sulfonic acid derivative.

Formula 13

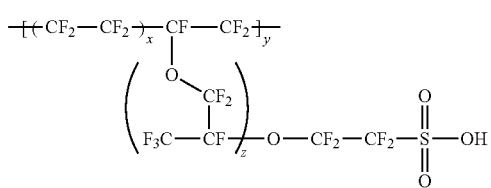

(13)

In the formula, x, y, and z are integers that are 1 or greater.

The compound having the structure indicated in Formula 13 is a fluorinated ether sulfonic acid derivative. In Formula 13, x, y, and z may be the same or may differ, as long as they are integers that are 1 or greater. A specific example of the compound having the structure indicated in Formula 13 includes a compound of which the sum of x, y, and z in Formula 13 is 20 or less, since sufficient hole injection characteristics are able to be obtained.

As long as the compound is a sulfonic acid derivative, the compound is not limited to the foregoing compound indicated in Formula 1 and the like. However, as a result of the hole injection layer 21 being formed using one type or two or more types of the compound indicated in Formula 1 and the like, higher hole injection characteristics are able to be obtained.

Film thickness of the hole injection layer 21 is not particularly limited. However, the film thickness is preferably from 5 nm to 50 nm both inclusive. Drive voltage is lower compared to when the film thickness is not within the foregoing range. Therefore, light emitting efficiency and reliability, such as life characteristics, are able to be improved. In particular, the film thickness of the hole injection layer 21 is preferably from 10 nm to 35 nm, both inclusive, for further effectiveness.

A wet process (coating method) is preferable as a method of forming the hole injection layer 21. As a result, even if foreign matter is present on the anode 11 and peripheral edges thereof before the hole injection layer 21 is formed, short-circuit caused by the foreign matter is suppressed. Specifically, even when foreign matter is present on the anode 11, the organic film formed by a wet process is able to favorably cover the anode 11 such that an uncovered section is not formed. Therefore, when the cathode 31 is formed, short-circuit between electrodes that may occur because of the uncovered section of the organic layer 20 is suppressed, and formation of a non-light emitting device is inhibited. As a result, yield is improved and cost reduction becomes possible. Compared to the case where a vapor-phase deposition method such as vacuum evaporation method is used, cost is able to be further reduced. Examples of the wet process include typical methods, such as spin coating, dip coating, ink jet method, and spray method. Examples of a solvent used to form each layer of the organic layer 20 by the wet process include water, methanol, N,N-dimethylformamide, N,N-dimethylacetamide, N-methylpyrrolidone, N,N'-dimethylimidazolidinone, dimethyl sulfoxide, chloroform, toluene.

In addition to the foregoing solvents, the following solvents may be mixed and used to adjust viscosity, boiling point, and the like: cyclohexanol, ethylene glycol, ethylene glycol diglycidyl ether, 1,3-octylene glycol, diethylene glycol, dipropylene glycol, triethylene glycol, tripropylene glycol, 1,3-butanediol, 1,4-butanediol, propylene glycol, hexylene glycol, butyl cellosolve, diethylene glycol diethyl ether, dipropylene glycol monomethyl ether, ethyl carbitol, diacetone alcohol, γ-butyrolactone, and ethyl lactate.

The hole transport layer 22 is intended to efficiently transport the holes injected from the hole injection layer 21 to the light emitting layer 23. Examples of a material composing the hole transport layer 22 include N,N'-bis(1-naphthyl)-N,N'-diphenyl-1,1'-biphenyl-4,4-diamine (NPD), N,N'-diphenyl-N,N'-bis(3-methylphenyl)-1,1'-diphenyl-4,4'-diamine (TPD), and N,N'-diphenyl-N,N'-bis[N-phenyl-N-(2-naphthyl)-4'-aminobiphenyl-4-yl]-1,1'-biphenyl-4,4'-diamine (NPTE). The hole injection layer 21 may also be used as the hole transport layer 22.

The light emitting layer 23 is an area in which, when an electric field is applied between the anode 11 and the cathode 31, the holes injected from the anode 11 side and the electrons injected from the cathode 31 side recombine, thereby generating light. A material composing the light emitting layer 23 preferably has a light emitting function (a function for providing a place for recombination of holes and electrons, and leading the recombination to light emission) and, for example, an electric charge injection function and an electric charge transport function. As a result, light emitting efficiency is improved. In addition, light emission becomes possible even when the hole transport layer 22 and the electron transport layer 24, described hereafter, are not provided. The electric charge injection function refers to a function capable of injecting the holes from the hole injection layer 21 and injecting the electrons from the cathode 31 when the electric field is applied. The electric charge transport function refers to a function for moving the injected holes and electrons using force of the electric field. In other words, the light emitting layer 23 may also serve as the hole transport layer 22 having hole transporting characteristics and the electron transport layer 24 having electron transporting characteristics.

In the light emitting layer 23, for example, a compound serving as a host (host material) is doped with a light emitting dye (light-emitting guest material) of each color (blue, green, and red). When the electric field is applied, light of each color is emitted depending on the color tone of the light emitting dye.

Examples of the host material include a naphthalene derivative, an indene derivative, a phenanthrene derivative, a pyrene derivative, a naphthacene derivative, a triphenylene derivative, an anthracene derivative, a perylene derivative, a picene derivative, a fluoranthene derivative, an acephenanthrylene derivative, a pentaphene derivative, a pentacene derivative, a coronene derivative, a butadiene derivative, a stilbene derivative, a tris(8-quinolinato)aluminum complex, and a bis(benzoquinolinato)beryllium complex. A specific example includes 9,10-di(2-naphthyl)anthracene (ADN).

A material having high light emitting efficiency, such as a low molecular fluorescent dye, a fluorescent polymer, and an organic light emitting material, such as a metal complex, are used as the light-emitting guest material. The light-emitting guest material of each color will be described hereafter.

A blue light-emitting guest material is a compound having a light emission peak within a wavelength range of about 400 nm to 490 nm. Examples of such organic compound include a naphthalene derivative, an anthracene derivative, a naphthacene derivative, a styrylamine derivative, and a bis(azinyl)methane boron complex. Specific examples include an aminonaphthalene derivative, an aminoanthracene derivative, an aminochrysene derivative, an aminopyrene derivative, a styrylamine derivative, and a bis(azinyl)methene boron complex. One type or two or more types thereof are preferably used.

A green light-emitting guest material is a compound having a light emission peak within a wavelength range of about 490 nm to 580 nm. Examples of such organic compound include a naphthalene derivative, an anthracene derivative, a pyrene derivative, a naphthacene derivative, a fluoranthene derivative, a perylene derivative, a coumarin derivative, a quinacridone derivative, an indeno[1,2,3-cd]perylene derivative, and a bis(azinyl)methane boron complex pyran pigment. Specific examples include an aminoanthracene derivative, a fluoranthene derivative, a coumarin derivative, a quinacridone derivative, an indeno[1,2,3-cd]perylene derivative, and a bis(azinyl)methane boron complex. One type or two or more types thereof are preferably used.

A red light-emitting guest material is a compound having a light emission peak within a wavelength range of about 580 nm to 700 nm. Examples of such organic compound include nile red, a pyran derivative such as DCM1 ({4-dicyanomethylene-2-methyl-6-(p-dimethylaminostyryl)-4H-pyran}) and DCJT ({4-(dicyanomethylene)-2-t-butyl-6-(julolidylstyryl)-pyran}), a squarylium derivative, a porphyrin derivative, a chlorine derivative, and a julolidine derivative. One type or two or more types thereof are preferably used.

The light emitting layer 23 may use the foregoing light-emitting guest material of each color and emit light of one of the colors. Alternatively, layers that respectively emit light of one of the colors may be layered, and the emitted light may be white. In other words, the light emitting layer 23 may be any of a blue light emitting layer, a green light emitting layer, and a red light emitting layer, or may be a white light emitting layer in which the blue light emitting layer, the green light emitting layer, and the red light emitting layer are layered. The light emitting layer 23 may also emit light of other color tones.

The electron transport layer 24 is intended to efficiently transport the electrons injected from the cathode 31 to the light emitting layer 23. Examples of a material composing the electron transport layer 24 include quinoline, perylene, phenanthroline, bis-styryl, pyradine, triazole, oxazole, oxadiazole, and fluorenone, or a derivative or a metal complex of the materials. A specific example includes tris(8-hydroxyquinoline)aluminum (abbreviated to Alq3). Other examples include anthracene, naphthalene, phenanthrene, pyrene, perylene, butadiene, coumarin, acridine, stilbene, and 1,10-phenanthroline, or a derivative or a metal complex of the materials. The materials may be used singly, or a plurality of types may be mixed and used.

The cathode 31 is one of the electrodes that apply an electric field to the light emitting layer 23. The cathode 31 is composed of a light transmitting material. Therefore, the emitted light from the light emitting layer 23 and light that is the emitted light reflected by the surface of the anode 11 are extracted outside from the cathode 31. In the cathode 31, a layer is formed on the light emitting layer 23 side using a material having a small work function. A first cathode layer 31A and a second cathode layer 31B are layered in sequence from the light emitting layer 23 side.

The first cathode layer 31A is composed of a material having favorable light transmittance, a small work function, and the capability of efficiently injecting the electrons into the electron transport layer 24. Examples of such material include an alkali metal oxide, such as $Li_2O$, $Cs_2O$, LiF, and $CaF_2$, an alkali metal fluoride, an alkali earth metallic oxide, and an alkali earth fluoride. The materials may be used singly, or a plurality of types may be mixed and used.

The second cathode layer 31B is composed of a material having light transmittance and good conductivity, such as a thin film MgAg electrode material and a Ca electrode material. If the organic electroluminescence device 1 particularly includes a cavity structure in which emitted light is resonated between the anode 11 and the cathode 31 and extracted, the second cathode layer 31B may be composed using, for example, a semi-transmissive reflective material such as Mg—Ag (9:1) with a thickness of 10 nm.

If necessary, the cathode 31 may have a structure in which a third cathode layer (not illustrated) is layered on the second cathode layer 31B as a sealing electrode for suppressing electrode deterioration.

Examples of a method of forming each layer (the first cathode layer 31A, the second cathode layer 31B and, if necessary, the third cathode layer) of the cathode 31 include vacuum evaporation method, sputtering, and plasma chemical vapor deposition (CVD) method.

The organic electroluminescence device 1 is manufactured, for example, as follows.

First, the anode 11 is formed on the substrate 10 by evaporation method, sputtering, and the like. Then, the organic layer 20 is formed on the anode 11. In this case, first, the hole injection layer 21 composed of a sulfonic acid derivative is formed on the anode 11 by a wet process (coating method) such as spin coating. Then, the hole transport layer 22, the light emitting layer 23, and the electron transport layer 24 are sequentially layered on the hole injection layer 21 by a vapor-phase deposition method such as vacuum evaporation method. As a result, the organic layer 20 is formed. Finally, the first cathode layer 31A and the second cathode layer 31B are sequentially layered on the electron transport layer 24 by evaporation method and the like, thereby forming the cathode 31. As a result, the organic electroluminescence device illustrated in FIG. 1 is completed. Here, in the organic layer 20, the hole transport layer 22, the light emitting layer 23, and the electron transport layer 24 are formed by a vapor-phase deposition method such as vacuum evaporation method. However, the hole transport layer 22, the light emitting layer 23, and the electron transport layer 24 may be formed using a wet process. As a result, as described above, occurrence of short-circuit caused by incorporation of foreign matter is suppressed, and yield and the like are further improved.

In the organic electroluminescence device 1, when voltage is applied between the anode 11 and the cathode 31, and an electric field is applied to the organic layer 20, the holes from the anode 11 are efficiently injected into the hole transport layer 22 by the hole injection layer 21. The injected holes are efficiently transported to the light emitting layer 23 by the hole transport layer 22. Meanwhile, electrons from the cathode 31 are transported to the light emitting layer 23 by the electron transport layer 24. The holes that have moved from the anode 11 side and the electrons that have moved from the cathode 31 side in this way are recombined in the light emitting layer 23, and light is emitted. The emitted light from the light emitting layer 23 and the light that is the emitted light reflected by the surface of the anode 11 pass through the cathode 31 and are emitted.

The organic electroluminescence device 1 according to the embodiment has the hole injection layer 21 composed of a sulfonic acid derivative between the anode 11 and the light emitting layer 23. As a result, favorable hole injection characteristics for hole injection from the anode 11 containing at least aluminum to the light emitting layer 23 are able to be obtained. Therefore, when the electric field is applied to the organic layer 20, the light emitting layer 23 efficiently emits light in response to the applied current. Further, compared to the case where the hole injection layer 21 contains another compound (such as an aniline derivative) in addition to a sulfonic acid derivative or the case where the hole injection layer 21 is composed of a compound (such as an azatriphenylene derivative) other than a sulfonic acid derivative, a highly homogenous hole injection layer 21 is able to be obtained without being affected by the environment during manufacturing. Therefore, favorable hole injection characteristics are able to be maintained for a long period. Thus, high light emitting efficiency is able to be obtained, and reliability such as life characteristics is able to be improved. Further, cost reduction is possible since inexpensive aluminum is used in the anode 11 and an expensive aniline derivative is not necessary for the hole injection layer 21.

Since aluminum has high reflectance, as a result of use of the anode 11 containing at least aluminum, the amount of light that passes through the cathode 31 is able to be secured. In other words, drive voltage is able to be reduced. Further, if the anode 11 contains aluminum as the main component and an element having a work function lower than that of aluminum as the accessory component, sufficient hole injection characteristics are able to be obtained and stability is improved. Therefore, reliability is able to be further improved while maintaining favorable light emitting efficiency.

In this case, the sulfonic acid derivative composing the hole injection layer 21 includes: the compound indicated in Formula 1; at least one type of the compound indicated in Formula 2, the compound having the structure expressed in Formula 3, and the polymer compound having the structure indicated in Formula 4; at least one type of the compound indicated in Formula 7, the compound indicated in Formula 8, the compound having the structure indicated in Formula 9, and the compound having the structure indicated in Formula 11; or the compound having the structure indicated in Formula 13. As a result, higher light emitting efficiency is able to be obtained and reliability such as life characteristics is able to be further improved.

In particular, as a result of the hole injection layer 21 being formed by a coating method, high light emitting efficiency is able to be obtained, and occurrence of short-circuit caused by foreign matter on the anode 11 is able to be suppressed. Therefore, leak devices are reduced and reliability is able to be further improved. Moreover, cost is reduced and yield is improved.

Further, as a result of the thickness of the hole injection layer 21 being from 5 nm to 50 nm, both inclusive, drive voltage is able to be further reduced. Therefore, higher light emitting efficiency is obtained and life characteristics are further improved. Thus, in particular, reliability is able to be improved.

Next, an application example of the foregoing organic electroluminescence device 1 will be described. Here, the foregoing organic electroluminescence device 1 is used as follows in the case where a display unit is given as an example.

2. Display Unit

Figure 2:
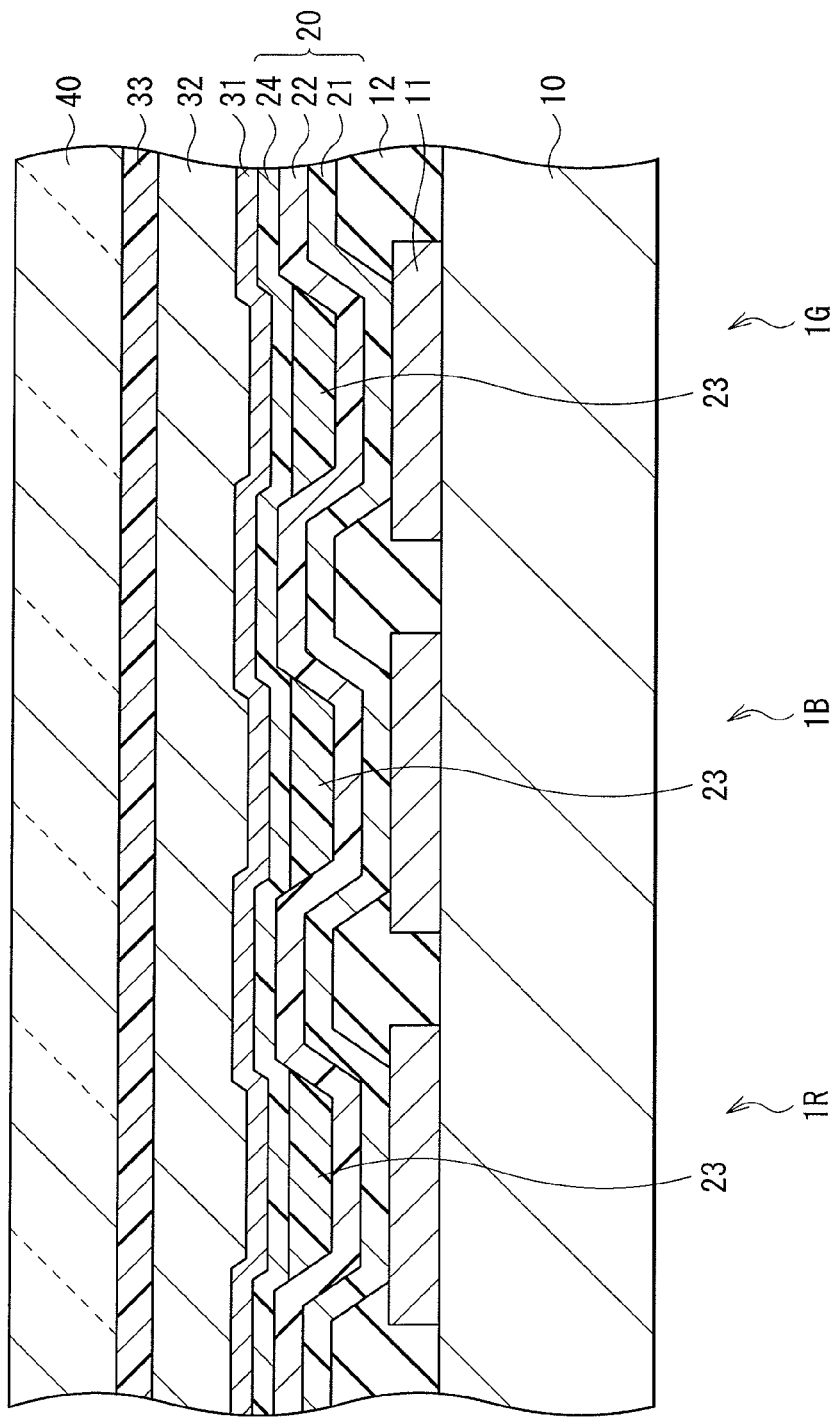
FIG. 2 is a schematic diagram illustrating a cross-sectional structure of a display unit including the organic electroluminescence device illustrated in FIG. 1.

FIG. 2 illustrates a cross-sectional configuration of a display unit. The display unit is configured to have an insulating layer 12 and organic electroluminescence devices 1R, 1G, and 1B on the substrate 10 that includes a drive circuit (not illustrated), such as a TFT. In the display unit, a protective layer 32 is formed on the organic electroluminescence devices 1R, 1G, and 1B to cover the organic electroluminescence devices 1R, 1G, and 1B. The whole area is sealed by a sealing substrate 40 that is adhered by an adhesive layer 33 provided on the protective layer 32. In other words, a drive system of the display unit described herein is an active matrix drive system.

The substrate 10 is provided with a drive circuit (not illustrated), such as a TFT, for each organic electroluminescence device 1R, 1G, and 1B and a planarizing insulating film (not illustrated) on a transparent substrate, such as glass, a silicon substrate, a film-like flexible substrate, and the like.

The organic electroluminescence devices 1R, 1G, and 1B have a structure similar to that of the foregoing organic electroluminescence device 1. Here, light extracted from the organic electroluminescence devices 1R, 1G, and 1B are respectively red, green, and blue in the display unit. The sealing substrate 40, described hereafter, has a color filter (not illustrated). Therefore, the light emitting layers 23 of the organic electroluminescence devices 1R, 1G, and 1B have the same structure. However, the light emitting layers 23 may each have a different structure. In this case, the light-emitting guest materials in the respective light emitting layers 23 of the organic electroluminescence devices 1R, 1G, and 1B differ.

The insulating layer 12 is intended to ensure insulation between the anodes 11 and the cathodes 31 of the organic electroluminescence devices 1R, 1G, and 1B and to accurately form a light emitting region into a desired shape. The insulating layer 12 is provided on the substrate 10 between the respective anodes 11 of the organic electroluminescence devices 1R, 1G, and 1B, such as to surround each anode 11 and form an aperture section. The insulating layer 12 is composed of a photosensitive resin such as polyimide. Here, the organic layer 20 and the cathode 31 are provided continually even on the insulating layer 12. However, the emission light is generated only in the aperture sections of the insulating layer 12 (upper portion of the anodes 11).

The protective layer 32 is intended to prevent infiltration of moisture and the like into the organic layer 20. The protective layer 32 is composed of a material having low water permeability and water absorbability, and has a sufficient thickness. Further, the protective layer 32 has high transmittance of light generated in the light emitting layer 23, and is composed of a material having, for example, a transmittance of 80% or more. The protective layer 32 has a thickness of, for example, about 2 μm to 3 μm, both inclusive. The protective layer 32 is composed of an amorphous insulating material. Specifically, the amorphous insulating material is preferably amorphous silicon (α-Si), amorphous silicon carbide (α-SiC), amorphous silicon nitride ($\alpha\text{-}Si_{1-x}N_x$), or amorphous carbon (α-C). Since the amorphous insulating materials do not structure grains, the amorphous insulating materials have low water permeability and serve as a favorable protective layer 32. The protective layer 32 may also be composed of a transparent conductive material such as ITO.

The adhesive layer 33 is composed of, for example, a thermoset resin or an ultraviolet curing resin.

The sealing substrate 40 is positioned on the cathode 31 side of the organic electroluminescence devices 1R, 1G, and 1B, and is intended to seal the organic electroluminescence devices 1R, 1G, and 1B with the adhesive layer 33. The sealing substrate 40 is composed of a material such as glass that is capable of transmitting light generated by the organic electroluminescence devices 1R, 1G, and 1B. The sealing substrate 40 is, for example, provided with a color filter (not illustrated). As a result, the light generated by the organic electroluminescence devices 1R, 1G, and 1B may be extracted and outside light reflected by the organic electroluminescence devices 1R, 1G, and 1B and wirings therebetween (not illustrated) may be absorbed, thereby improving contrast.

The color filter may be provided on either side of the sealing substrate 40. However, the color filter is preferably provided on the organic electroluminescence devices 1R, 1G, and 1B side, since the color filter is not exposed to the outside and is able to be further protected by the adhesive layer 33. Further, as a result of the distance between the light emitting layer 23 and the color filter being short, the light emitted from the organic electroluminescence devices 1R, 1G, and 1B is able to be prevented from entering an adjacent color filter of another color and causing mixed colors. The color filter has a red filter, a green filter, and a blue filter (not illustrated) that are arranged sequentially in correspondence with the organic electroluminescence devices 1R, 1G, and 1B. The red filter, the green filter, and the blue filter are each formed into, for example, a rectangle with no space therebetween. The red filter, the blue filter, and the green filter may each be composed of a resin mixed with a pigment. Through selection of the pigment, adjustment is made such that light transmittance in the intended red, green, or blue wavelength region is high and light transmittance in the other wavelength regions is low.

The display unit is able to be manufactured, for example, as follows.

First, the substrate 10 is prepared. Then, the anode 11 is formed on the substrate 10 by, for example, sputtering and is formed into a desired shape by, for example, dry etching.

Subsequently, the whole area of the substrate 10 is coated with a photosensitive resin so as to cover the anode 11. The aperture section is provided in correspondence to the light emitting region by, for example, photolithography technology. The photosensitive resin is then fired, thereby forming the insulating layer 12.

Then, after the organic layer 20 is formed by, for example, a process similar to the foregoing process for manufacturing the organic electroluminescence device 1, the cathode 31 is formed on the organic layer 20. In this way, the organic electroluminescence devices 1R, 1G, and 1B are formed.

After the organic electroluminescence devices 1R, 1G, and 1B are formed, the protective layer 32 is formed thereon. The method of forming the protective layer 32 is preferably a film forming method in which film formation particle energy is small to a degree at which the base is minimally affected, such as evaporation method and CVD method. The protective layer 32 is preferably formed successively with the formation of the cathode 31 without exposing the cathode 31 to the atmosphere, since deterioration of the organic layer 20 caused by moisture and oxygen within the atmosphere is able to be suppressed. Further, to prevent decrease in luminance caused by deterioration of the organic layer 20, film forming temperature of the protective layer 32 is preferably set to normal temperature. To prevent peeling of the protective layer 32, the protective layer 32 is preferably formed under conditions in which stress on the film is minimum.

The sealing substrate 40 is coated with, for example, a material for the red filter by spin coating or the like. The material is then patterned by photolithography technology and fired, thereby forming the red filter. Next, the blue filter and the green filter are successively formed in a manner similar to the red filter.

Then, the adhesive layer 33 is formed on the protective layer 33. The sealing substrate 40 is adhered to the protective layer 32 with the adhesive layer 33 therebetween. At this time, the surface of the sealing substrate 40 on which the color filter is formed is preferably positioned on the organic electroluminescence device 1R, 1G, and 1B side. As a result, the display unit illustrated in FIG. 2 is completed.

In such a display unit, in each organic electroluminescence device 1R, 1G, and 1B selected based on image data, an electric field is applied to the organic layer 20 when drive voltage is applied between the anode 11 and the cathode 31. In the organic layer 20 to which the electric field is applied, the holes and electrons recombine in the light emitting layer 23 and emitted light is generated. The emitted light passes through the color filter and the sealing substrate 40, and is extracted.

According to the display unit, as a result of the organic electroluminescence devices 1R, 1G, and 1B having structures similar to that of the foregoing organic electroluminescence device 1, high light emitting efficiency is able to be obtained, and reliability such as life characteristics is able to be improved. Other effects are similar to those of the organic electroluminescence device 1.

3. Modified Example

In the organic electroluminescence device 1 according to the embodiment, when the hole injection layer 21, the hole transport layer 22, the light emitting layer 23, and the electron transport layer 24 composing the organic layer 20 are each formed as a single layer is mainly described. However, the hole injection layer 21, the hole transport layer 22, the light emitting layer 23, and the electron transport layer 24 may each be formed with a plurality of layers. In this case as well, similar effects are able to be obtained.

According to the foregoing embodiment and modified example, an organic electroluminescence device that includes a single organic layer 20 is described. However, the organic layers 20 may be stacked to form a so-called stacked type. The stacked type is a structure also referred to as a multiphoton emission device (MPE device) described, for example, in Japanese Unexamined Patent Application Publication No. 2003-272860. In this way, similar effects are able to be obtained even when a plurality of organic layers 20 are stacked with an insulating electric charge generating layer therebetween.

EXAMPLES

Specific examples of the invention will be described in detail.

Experiment Example 1-1

The organic electroluminescence device 1 illustrated in FIG. 1 was formed by the following process.

First, the anode 11 was formed on the substrate 10 made of glass with a dimension of 30 mm×30 mm. In that case, an aluminum alloy layer (AlNd layer with a thickness of 150 nm) was deposited as a first layer, the aluminum alloy layer containing 10 wt % of neodymium (Nd) that is a lanthanoid. Then, the first layer was exposed to atmosphere. A natural oxide film of the aluminum alloy having a thickness of 5 nm was formed on the surface of the first layer as a second layer of the anode 11. The reflectance of the anode 11 was 90% or more for light having a wavelength of 450 nm.

Then, an insulating layer composed of silicon oxide ($SiO_2$) was formed by radio frequency (RF) sputtering on the anode 11 to have an aperture section with a dimension of 2 mm×2 mm that serves as a light emitting region.

Next, the organic layer 20 was formed on the anode 11 and the insulating layer. First, the hole injection layer 21 having a thickness of 20 nm was formed on the anode 11. In that case, the compound (5-sulfosalicylic acid) indicated in Formula (1-1) that is the compound indicated in Formula 1 was used as the material composing the hole injection layer 21. The compound was dissolved in N,N'-dimethylimidazolidinone (DMI) to a solid content concentration of 1.5 wt %. The solution was used to form a coating film by spin coating (at 3000 rmp for 120 seconds) under atmosphere. Then, the coating film was heated for 30 minutes at 200 deg C. by a furnace at atmosphere and dried. The coating film was subsequently cooled to room temperature (25 deg C. with a humidity of 40%) at atmosphere.

Next, the hole transport layer 22 having a thickness of 118 nm was formed on the hole injection layer 21 by evaporation method. At that time, the evaporation rate was 0.2 to 0.4 nm/secm both inclusive. In that case, a compound (α-NPD) represented in Formula 14 was used as the material forming the hole transport layer 22.

Formula 14

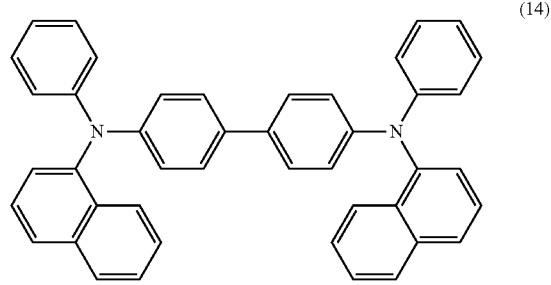

(14)

Next, the light emitting layer 23 having a film thickness of 30 nm was formed on the hole transport layer 22 by evaporation method. In that case, a compound (aminochrysene derivative) represented in Formula 16 serving as a light-emitting guest material (dopant) was doped using a compound (ADN) represented in Formula 15 as a host material. The evaporation rate was respectively 2.0 nm/sec (host material) and 0.11 nm/sec (light-emitting guest material). The doping amount of the light-emitting guest material was set so that concentration was 5% in terms of film thickness ratio.

Formula 15

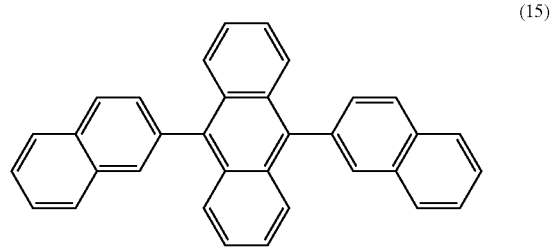

(15)

Formula 16

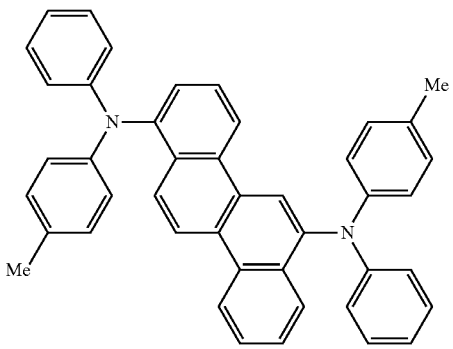

(16)

Next, the electron transport layer 24 having a thickness of 20 nm was formed on the light emitting layer 23 by evaporation method. In this case, a compound (Alq3) represented in Formula 17 was deposited at an evaporation rate of 2 nm/sec. As a result, the organic layer 20 was formed.

Formula 17

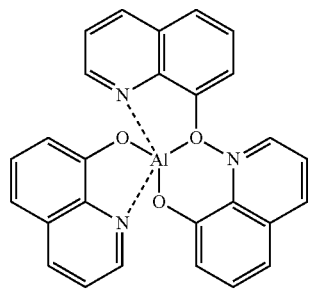

(17)

Next, the cathode 31 having the first cathode layer 31A and the second cathode layer 31B was formed on the organic layer 20 by vacuum evaporation method. In that case, the first cathode layer 31A composed of LiF and having a thickness of about 0.3 nm was formed at an evaporation rate of 0.01 nm/sec. Then, the second cathode layer 31B composed of MgAg (volume ratio of 9:1) and having a thickness of 10 nm was formed at evaporation rates of 1.5 nm/sec (Mg) and 0.17 nm/sec (Ag). As a result, the organic electroluminescence device 1 illustrated in FIG. 1 was completed. In the Experiment example 1-1, a hundred organic electroluminescence devices 1, described above, were formed. The same applies to Experiment examples 1-2 to 1-19 hereafter.

Experiment Example 1-2

A process similar to that in Experiment example 1-1 was performed, except that the compound (4-sulfophthalic acid) indicated in Formula (1-2) that is the compound indicated in Formula 1 was used in place of the compound indicated in Formula (1-1) when forming the hole injection layer 21.

Experiment Example 1-3

A process similar to that in Experiment example 1-1 was performed, except that the compound (naphthalenedisulfonic acid compound) indicated in Formula (2-1) that is the compound indicated in Formula 2 was used in place of the compound indicated in Formula (1-1) when forming the hole injection layer 21.

Experiment Example 1-4

A process similar to that in Experiment example 1-1 was performed, except that the compound (naphthalenedisulfonic acid compound) indicated in Formula (2-2) that is the compound indicated in Formula 2 was used in place of the compound indicated in Formula (1-1) when forming the hole injection layer 21.

Experiment Example 1-5

A process similar to that in Experiment example 1-1 was performed, except that the compound (naphthalenedisulfonic acid compound) having the structure indicated in Formula (3-1) that is the compound having the structure indicated in Formula 3 was used in place of the compound indicated in Formula (1-1) when forming the hole injection layer 21. Here, a compound of which b in Formula (3-1) is 5 was used.

Experiment Example 1-6

A process similar to that in Experiment example 1-1 were performed, except that the polymer compound (styrenesulfonic acid compound) having the structure indicated in Formula 4 was used in place of the compound indicated in Formula (1-1) when forming the hole injection layer 21. Here, a compound of which i in Formula 4 is about 1000 was used.

Experiment Example 1-7

A process similar to that in Experiment example 1-1 was performed, except that the compound (1,4-benzodioxane sulfonic acid compound) indicated in Formula (7-1) that is the compound indicated in Formula 7 was used in place of the compound indicated in Formula (1-1) when forming the hole injection layer 21.

Experiment Example 1-8

A process similar to that in Experiment example 1-1 was performed, except that the compound indicated in Formula (7-2) that is the compound indicated in Formula 7 was used in place of the compound indicated in Formula (1-1) when forming the hole injection layer 21. Here, a compound of which a+b+c in Formula (7-2) is 2 to 4, both inclusive, was used.

Experiment Example 1-9

A process similar to that in Experiment example 1-1 were performed, except that the compound indicated in Formula (8-1) that is the compound indicated in Formula 8 was used in place of the compound indicated in Formula (1-1) when forming the hole injection layer 21.

Experiment Example 1-10

A process similar to that in Experiment example 1-1 was performed, except that the compound indicated in Formula (8-4) that is the compound indicated in Formula 8 was used in place of the compound indicated in Formula (1-1) when forming the hole injection layer 21.

Experiment Example 1-11

A process similar to that in Experiment example 1-1 was performed, except that the compound indicated in Formula (8-2) that is the compound indicated in Formula 8 was used in place of the compound indicated in Formula (1-1) when forming the hole injection layer 21.

Experiment Example 1-12

A process similar to that in Experiment example 1-1 was performed, except that the compound indicated in Formula (8-3) that is the compound indicated in Formula 8 was used in place of the compound indicated in Formula (1-1) when forming the hole injection layer 21.

Experiment Example 1-13

A process similar to that in Experiment example 1-1 was performed, except that the compound having the structure indicated in Formula (11-1) was used as the compound having the structure indicated in Formula 11 in place of the compound indicated in Formula (1-1) when forming the hole injection layer 21. Here, a compound of which $u_1$ in Formula (11-1) is 5 was used.

Experiment Example 1-14

A process similar to that in Experiment example 1-1 was performed, except that the compound having the structure indicated in Formula (9-1) that is the compound having the structure indicated in Formula 9 was used in place of the compound indicated in Formula (1-1) when forming the hole injection layer 21. Here, a compound of which $q_1$ in Formula (9-1) is 5 was used.

Experiment Example 1-15

A process similar to that in Experiment example 1-1 was performed, except that the compound (fluorinated ether sulfonic acid compound) having the structure indicated in Formula 13 was used in place of the compound indicated in Formula (1-1) when forming the hole injection layer 21. Here, a compound of which x, y, and z in Formula 13 is $3 \leq x+y+z \leq 20$ was used.

Experiment Example 1-16

A process similar to that in Experiment example 1-1 was performed, except that a mixture (molar ratio of 1:1) of the compound indicated in Formula (1-1) and the compound having the structure indicated in Formula (9-1) was used in place of the compound indicated in Formula (1-1) when forming the hole injection layer 21. Here, a compound of which $q_1$ in Formula (9-1) is 5 was used as the compound having the structure indicated in Formula (9-1).

Next, as comparative examples for the Experiment examples 1-1 to 1-16, Experiment examples 1-17 to 1-19 will be described.

Experiment Example 1-17

A process similar to that in Experiment example 1-1 was performed, except that a mixture in which an aniline pentamer indicated in Formula 18 and the compound indicated in Formula (1-1) are mixed with a molar ratio [Formula 18:Formula (1-1)] of 1:3 was used in place of the compound indicated in Formula (1-1) when forming the hole injection layer 21.

Formula 18

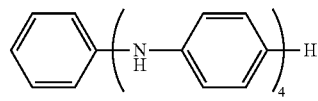

Experiment Example 1-18

A process similar to that in Experiment example 1-1 was performed, except that an azatriphenylene derivative indicated in Formula 19 was used in place of the compound indicated in Formula (1-1) when forming the hole injection layer 21, and the hole injection layer 21 was formed by vacuum evaporation method (evaporation rate of 1 nm/sec and film thickness of 20 nm).

Formula 19

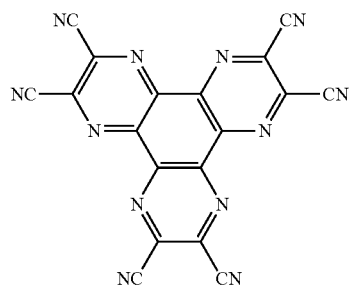

Experiment Example 1-19

A process similar to that in Experiment example 1-1 was performed, except that the hole injection layer 21 was not provided and the hole transport layer 22 was formed using the compound (α-NPD) indicated in Formula 14 and having a film thickness of 138 nm.

Regarding the organic electroluminescence devices 1 in the foregoing Experiment examples 1-1 to 1-19, results indicated in Table 1 were obtained by measuring drive voltage and light emitting efficiency, evaluating light emitting life, and examining dark spot growth and the number of leak devices.

When measuring drive voltage and light emitting efficiency, current density was 10 mA/cm². When evaluating light emitting life, the time until relative luminance decreased by 10% with respect to initial luminance when driven at a current density of 100 mA/cm² at peak and 50% duty cycle was measured. Dark spot growth was evaluated by measuring the initial total dark spot area at a current density of 10 mA/cm² and the total dark spot density after driving for 1000 hours, and determining the area ratio [(total dark spot area after driving for 1000 hours)/(initial total dark spot area)]. All foregoing characteristics evaluations were performed under conditions in which atmospheric temperature was 25 deg C. and dew point temperature was −80 deg C., in a nitrogen gas atmosphere with an oxygen concentration of 0.5 ppm or less. Drive voltage and light emitting efficiency are average values of devices excluding leak devices. Light emitting life and dark spot growth results are those of a single device that is not leaking.

TABLE 1

|  | Material of hole injection layer | Drive voltage (V) | Light emitting efficiency (cd/A) | Life (h) | Dark spot growth (area ratio) | Number of leak devices (out of 100) |
|---|---|---|---|---|---|---|
| Experiment Example 1-1 | Formula (1-1) | 5.2 | 6.9 | 682 | 1.0 | 0 |
| Experiment Example 1-2 | Formula (1-2) | 5.1 | 7.1 | 696 | 1.0 | 0 |
| Experiment Example 1-3 | Formula (2-1) | 4.9 | 6.8 | 673 | 1.0 | 0 |
| Experiment Example 1-4 | Formula (2-2) | 4.9 | 7.0 | 685 | 1.0 | 0 |
| Experiment Example 1-5 | Formula (3-1) | 5.1 | 7.1 | 689 | 1.0 | 0 |
| Experiment Example 1-6 | Formula 4 | 5.1 | 7.1 | 678 | 1.0 | 0 |
| Experiment Example 1-7 | Formula (7-1) | 4.8 | 7.3 | 703 | 1.0 | 0 |
| Experiment Example 1-8 | Formula (7-2) | 5.2 | 7.0 | 681 | 1.0 | 0 |
| Experiment Example 1-9 | Formula (8-1) | 4.9 | 7.0 | 690 | 1.0 | 0 |
| Experiment Example 1-10 | Formula (8-4) | 4.9 | 7.2 | 679 | 1.0 | 0 |
| Experiment Example 1-11 | Formula (8-2) | 5.0 | 6.9 | 695 | 1.0 | 0 |
| Experiment Example 1-12 | Formula (8-3) | 4.9 | 6.9 | 701 | 1.0 | 0 |
| Experiment Example 1-13 | Formula (11-1) | 5.1 | 7.0 | 675 | 1.0 | 0 |
| Experiment Example 1-14 | Formula (9-1) | 5.0 | 7.1 | 699 | 1.0 | 0 |
| Experiment Example 1-15 | Formula 13 | 5.2 | 7.1 | 702 | 1.0 | 0 |
| Experiment Example 1-16 | Formula (1-1) + Formula (9-1) | 5.0 | 7.0 | 688 | 1.0 | 0 |
| Experiment Example 1-17 | Formula (1-1) + Formula 18 | 6.8 | 4.3 | 210 | 1.3 | 0 |
| Experiment Example 1-18 | Formula 19 | 4.8 | 7.2 | 682 | 2.0 | 7 |
| Experiment Example 1-19 | — | 15.2 | 1.3 | Not measured | Not measured | 9 |

As evidenced in Table 1, in Experiment examples 1-1 to 1-16, favorable device characteristics were indicated regarding drive voltage, light emitting efficiency, life, dark spot growth, and the number of leak devices, compared to Experiment examples 1-17 to 1-19.

Comparison of Experiment examples 1-1 to 1-16 and Experiment example 1-17 indicates that Experiment example 1-17 was inferior regarding drive voltage, light emitting efficiency, life, and dark spot growth. The result of Experiment example 1-17 are thought to have been caused by the following. In Experiment example 1-17, the hole injection layer 21 is formed by a mixture of an aniline derivative and a sulfonic acid derivative. Therefore, in the cooling process after firing in the process for forming the hole injection layer 21, moisture from the atmosphere forms condensation on the film surface. The sulfonic acid derivative aggregates in the condensation area. As a result, distribution of the sulfonic acid derivative and the aniline derivative within the hole injection layer 21 becomes uneven. An area in which the sulfonic acid derivative is sparse enters a non-light emitting state or a low luminance state and, in other words, becomes a dark spot. Such uneven distribution causes increase in drive voltage and decrease in light emitting efficiency. Since the uneven distribution advances with driving time, light emitting life shortens and the dark spot grows. On the other hand, although the foregoing condensation may occur in the Experiment examples 1-1 to 1-16, unevenness in the distribution of the sulfonic acid derivative does not occur even when condensation occurs since the hole injection layer 21 is formed only by the sulfonic acid derivative.

In Experiment example 1-18, the number of leak devices increased while drive voltage, light emitting efficiency, and life were almost the same, compared to Experiment examples 1-1 to 1-16. The number of devices in which short-circuit occurred between the anode 11 and the cathode 31 are thought to have increased since covering rate of foreign matter on the anode 11 by the organic layer 20 was low as a result of the hole injection layer 21 in Experiment example 1-18 being formed by vacuum evaporation method. In Experiment example 1-17, dark spot growth in the hole injection layer 21 caused by film peeling is thought to have increased in speed since adhesive force between the hole injection layer 21 and the anode 11 is small.

In Experiment example 1-19, increase in drive voltage and decrease in light emitting efficiency are thought to have occurred as result of hole injection characteristics of hole injection to the light emitting layer 23 decreasing since the hole injection layer 21 was not formed. In Experiment example 1-19, the number of leak devices is thought to have increased as a result of the organic layer 20 not having a layer formed by a coating method.

From the foregoing, the following confirmations were made regarding the organic electroluminescence device 1 including the anode 11 containing at least aluminum. In other words, as a result of the hole injection layer 21 being formed only by a sulfonic acid derivative, high light emitting efficiency is able to be obtained while reducing drive voltage, and life characteristics and the like are improved. Therefore, reliability is able to be improved.

Experiment Examples 2-1 to 2-10

The organic electroluminescence device was formed in a manner similar to Experiment example 1-14 except for the film thickness of the hole injection layer 21 being changed and the film thickness of the hole transport layer 22 being changed as indicated in Table 2, by adjustment of the concentration (solid content concentration of 0.2 to 2.5 wt %) of the solution containing the material composing the hole injection layer 21 and the rotation speed (750 to 6000 rpm) of spin coating when forming the coating film. In that case, the respective thickness of the hole injection layers 21 were 3, 4, 5, 10, 20, 35, 50, 55, 60, and 70 nm. The respective film thickness of the hole transport layers 22 corresponding to the hole injection layers 21 were 135, 134, 133, 128, 118, 103, 88, 83, 78, and 68 nm. When drive voltage of the organic electroluminescence devices in Experiment examples 2-1 to 2-10 were measured, results indicated in Table 2, FIG. 3A, and FIG. 3B were obtained. Experiment example 2-5 is the same as Experiment example 1-14.

TABLE 2

| | Thickness of hole injection layer (nm) | Thickness of hole transport layer (nm) | Drive voltage (V) |
|---|---|---|---|
| Experiment example 2-1 | 3 | 135 | 10 |
| Experiment example 2-2 | 4 | 134 | 7 |
| Experiment example 2-3 | 5 | 133 | 5.5 |
| Experiment example 2-4 | 10 | 128 | 5.1 |
| Experiment example 2-5 | 20 | 118 | 5 |
| Experiment example 2-6 | 35 | 103 | 5.2 |
| Experiment example 2-7 | 50 | 88 | 5.8 |
| Experiment example 2-8 | 55 | 83 | 6.5 |
| Experiment example 2-9 | 60 | 78 | 8 |
| Experiment example 2-10 | 70 | 68 | 12 |

Figure 3A:
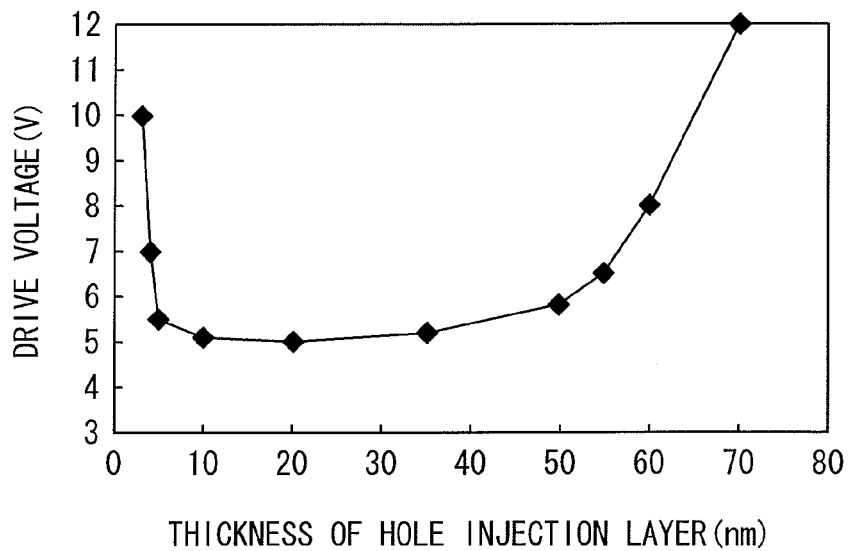
FIG. 3A and FIG. 3B are characteristics diagrams illustrating a relationship between thickness of a hole injection layer and drive voltage in experiment examples.
Figure 3B:
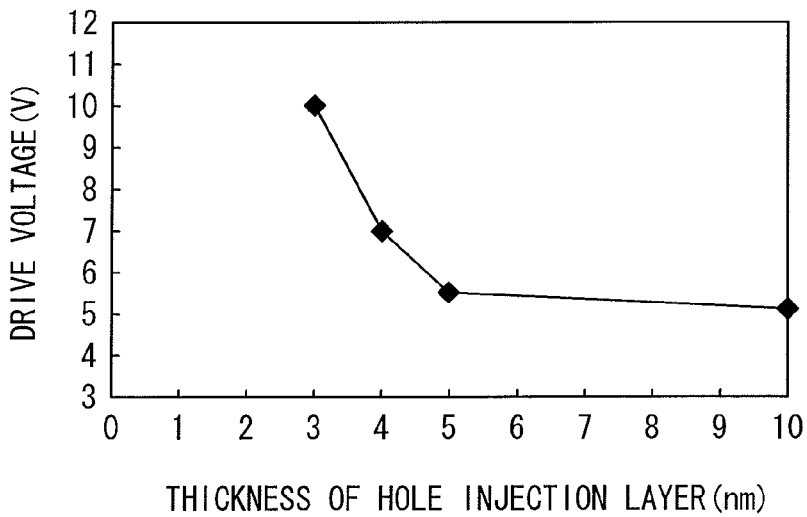
Figure 4:
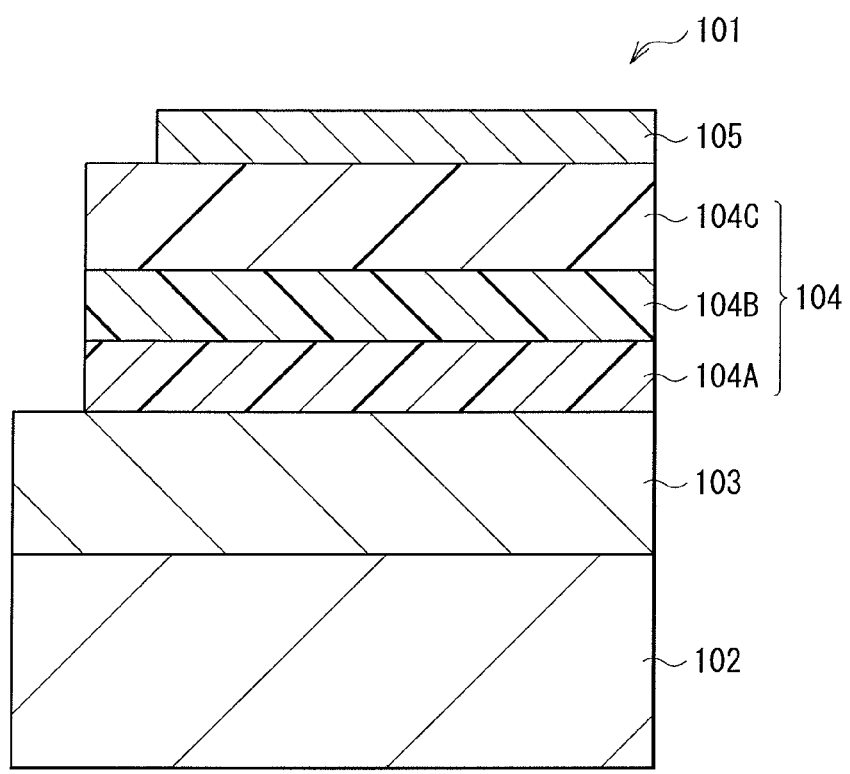
FIG. 4 is a cross-sectional view for explaining a structure of an existing organic electroluminescence device.

FIG. 3A illustrates a correlation between drive voltage and the film thickness of the hole injection layer 21. FIG. 3B is an enlarged view of the section in FIG. 3A where the film thickness is 10 nm or less. Further, Table 2 is a list of numerical data of the drive voltage for each film thickness of the hole injection layer 21. The results indicate that drive voltage is able to be reduced when the film thickness of the hole injection layer 21 is from 5 nm to 50 nm, both inclusive. In other words, confirmation has been made that, in the organic electroluminescence device 1 including the anode 11 containing at least aluminum, the film thickness of the hole injection layer 21 is preferably from 5 nm to 50 nm, both inclusive.

Sudden increase in drive voltage when the film thickness of the hole injection layer 21 is less than 5 nm is thought to show that the hole injection layer 21 incompletely covers the anode 11 and, therefore, a film thickness sufficient for function as the hole injection layer 21 has not been reached. Sudden increase in drive voltage when the film thickness of the hole injection layer 21 is larger than 50 nm is considered to show significant effect of voltage drop caused by resistance in the hole injection layer 21.

Although not indicated in the examples, in the case where drive voltage was measured using a sulfonic acid derivative (such as the compound indicated in Formula (1-1)) other than the compound having the structure indicated in Formula (9-1) and changing the thickness of the hole injection layer 21 as described above, drive voltage indicated the same trends as those of Experiment examples 2-1 to 2-10. On the other hand, in the case where drive voltage was measured while changing the thickness of the hole injection layer 21 containing a sulfonic acid derivative and an aniline derivative in a manner described above, drive voltages for all thicknesses were significantly higher than those in Experiment examples 2-1 to 2-10. In other words, in the organic electroluminescence device 1 in the examples, drive voltage is able to be reduced without dependence on the thickness of the hole injection layer 21. Therefore, high light emitting efficiency is able to be obtained and reliability is improved. In particular, because drive voltage is able to be further reduced by the thickness of the hole injection layer 21 being set within the foregoing range, light emitting efficiency and reliability are able to be further improved.

While the invention has been described with reference to the embodiment and the examples, the invention is not limited to the foregoing embodiment and the foregoing examples, and various modifications may be made. For example, according to the foregoing embodiment and examples, the description has been given of the top emission type organic electroluminescence device. However, the organic electroluminescence device may be a bottom emission type. In this case, the substrate is composed of a transparent material. The foregoing cathode, organic layer, and anode are sequentially layered on the substrate. The organic layer has a structure in which the electron transport layer, the light emitting layer, the hole transport layer, and the hole injection layer are layered in sequence from the cathode side.

According to the foregoing embodiment, the description has been given of an active matrix display unit. However, the display unit may be a passive type.

The present application contains subject matter related to that disclosed in Japanese Priority Patent Application JP 2009-274877 filed in the Japanese Patent Office on Dec. 2, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:
1. An organic electroluminescence device comprising:
an anode containing at least aluminum;
a cathode; and
an organic layer between the anode and the cathode, the organic layer including a light emitting layer;
wherein,
the organic layer has a hole injection layer between the anode and the light emitting layer, and
the hole injection layer comprises a sulfonic acid derivative with at least a compound expressed in Formula 1:

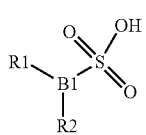

where B1 represents a trivalent group containing a benzene ring, a naphthalene ring, an anthracene ring, a phenanthrene ring, or a heterocycle, and each of R1 and R2 represent a carboxyl group or a hydroxyl group.

2. The organic electroluminescence device according to claim 1, wherein the sulfonic acid derivative contains a compound having a structure expressed in Formula 3, and a polymer compound having a structure expressed in Formula 4, Formulae 3 and 4 being:

Formula 3

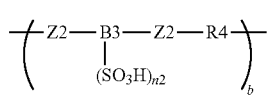

where (a) Z2 represents an oxygen atom, a sulfur atom, or —NH—, (b) B3 represents a ($n_2+2$) valence group containing a naphthalene ring or an anthracene ring, (c) R4 represents a hydrocarbon group, a group containing a 1,3,5-triazine ring, a group having the structure indicated in Formula 5, a group having the structure indicated in Formula 6, or a derivative of the foregoing groups, (d) b is an integer that is 1 or greater, and (e) $n_2$ is an integer that is from 1 to 4, both inclusive Formula 4

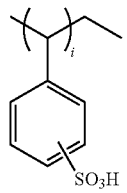

where i represents an integer that is 1 or greater, Formulas 5 and 6 being

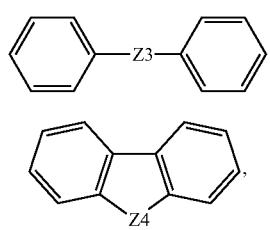

and
where each of Z3 and Z4 represent an oxygen atom, a sulfur atom, a sulfinyl group (—S(=O)—), a sulfonyl group (—S(=O)$_2$—), or a group containing any of a nitrogen atom, a silicon atom, a phosphorus atom, or a P(=O) group.

3. The organic electroluminescence device according to claim 1, wherein the hole injection layer is formed by a coating method.

4. The organic electroluminescence device according to claim 1, wherein a thickness of the hole injection layer is from 5 nm to 50 nm, both inclusive.

5. The organic electroluminescence device according to claim 1, wherein the anode has light reflectance and the cathode has light transmittance, and light emitted from the light emitting layer is emitted from the cathode side.

6. The organic electroluminescence device according to claim 4, wherein the anode contains aluminum as a main component and an element having a lower work function than that of aluminum as an accessory component.

7. A display unit comprising:
an organic electroluminescence device including (a) an anode containing at least aluminum, (b) a cathode, and (c) an organic layer between the anode and the cathode, wherein,
the organic layer includes a light emitting layer,
the organic layer includes a hole injection layer between the anode and the light emitting layer, and
the hole injection layer comprises a sulfonic acid derivative with a compound expressed in Formula 1:

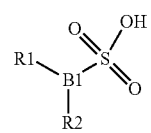

where B1 represents a trivalent group containing a benzene ring, a naphthalene ring, an anthracene ring, a phenanthrene ring, or a heterocycle, and each of R1 and R2 represent a carboxyl group or a hydroxyl group.

8. The display unit according to claim 7, wherein the sulfonic acid derivative contains a compound having a structure expressed in Formula 3, and a polymer compound having a structure expressed in Formula 4, Formulas 3 through 4 being:

Formula 3

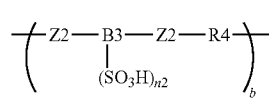

where (a) Z2 represents an oxygen atom, a sulfur atom, or —NH—, (b) B3 represents a ($n_2+2$) valence group containing a naphthalene ring or an anthracene ring, (c) R4 represents a hydrocarbon group, a group containing a 1,3,5-triazine ring, a group having the structure indicated in Formula 5, a group having the structure indicated in Formula 6, or a derivative of the foregoing groups, (d) b is an integer that is 1 or greater, (e) $n_2$ is an integer that is from 1 to 4, both inclusive, Formula 4

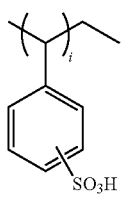
(4)

where i is an integer that is 1 or greater, Formulas 5 and 6 being:

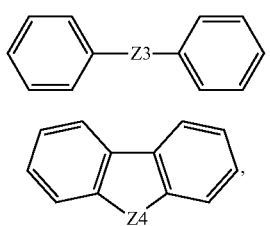
(5)

(6)

and where each Z3 and Z4 represent an oxygen atom, a sulfur atom, a sulfinyl group (—S(=O)—), a sulfonyl group (—S(=O)$_2$—), or a group containing any of a nitrogen atom, a silicon atom, a phosphorus atom, or a P(=O) group.

9. The display unit according to claim 7, wherein the hole injection layer is formed by a coating method.

10. The display unit according to claim 7, wherein a thickness of the hole injection layer is from 5 nm to 50 nm, both inclusive.

11. The display unit according to claim 7, wherein the anode has light reflectance and the cathode has light transmittance, and light emitted from the light emitting layer is emitted from the cathode side.

12. The display unit according to claim 7, wherein the anode contains aluminum as a main component and an element having a lower work function than that of aluminum as an accessory component.

* * * * *